US011099077B1

(12) United States Patent
Stammer et al.

(10) Patent No.: US 11,099,077 B1
(45) Date of Patent: Aug. 24, 2021

(54) BACKGROUND SUBTRACTED SPECTROMETER FOR AIRBORNE INFRARED RADIOMETRY

(71) Applicant: The United States of America, as Represented by the Secretary of the Navy, Arlington, VA (US)

(72) Inventors: Clinton F. Stammer, Camarillo, CA (US); David A. Sisemore, Oxnard, CA (US); Jack Ronald White, Camarillo, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 86 days.

(21) Appl. No.: 16/430,555

(22) Filed: Jun. 4, 2019

(51) Int. Cl.
*G01J 5/60* (2006.01)
*G01J 3/10* (2006.01)
(Continued)

(52) U.S. Cl.
CPC ............ *G01J 5/602* (2013.01); *G01J 3/108* (2013.01); *G01J 3/0205* (2013.01); *G01J 2005/604* (2013.01); *H01L 27/14649* (2013.01)

(58) Field of Classification Search
CPC .......... G01J 5/602; G01J 3/108; G01J 3/0205; G01J 2005/604
See application file for complete search history.

(56) References Cited

U.S. PATENT DOCUMENTS 5,166,755 A * 11/1992 Gat .......................... G01J 3/02
250/226
5,272,340 A 12/1993 Anbar
(Continued)

OTHER PUBLICATIONS

Hall et al. (Magi:A New High-Performance Airborne Thermal-Infrared Imaging Spectrometer for Earth Science Applications, IEE Transactions on Geoscience and Remote Sensing, vol. 53. No. Oct. 2015) (Year: 2015).*
(Continued)

*Primary Examiner* — David P Porta
*Assistant Examiner* — Djura Malevic
(74) *Attorney, Agent, or Firm* — Naval Air Warfare Center Weapons Division; Jimmy M. Sauz

(57) ABSTRACT

A background subtracted spectrometer for airborne infrared radiometry. The background subtracted spectrometer may comprise: a filter array, a detector, and a dewar containing liquid nitrogen. The filter array may be configured to selectively pass different spectral bands of infrared radiation. The filter array may comprise: at least one linear variable filter and a plurality of bandpass filters. The detector may comprise a focal plane array configured to receive the different spectral bands of infrared radiation simultaneously transmitted through the filter array. The detector may generate one or more electrical signals indicative of infrared radiation intensity as a function of wavelength. The filter array may be coupled to the focal plane array of the detector, and the filter array and detector may be conductively cooled by the liquid nitrogen to improve signal-to-noise ratio and spectral measurements. The background subtracted spectrometer preferably lacks a circular variable filter and relay lens.

20 Claims, 11 Drawing Sheets

(51) Int. Cl.
*H01L 27/146* (2006.01)
*G01J 3/02* (2006.01)

(56) References Cited

U.S. PATENT DOCUMENTS

| | | | | |
|---|---|---|---|---|
| 5,276,321 | A * | 1/1994 | Chang | G01C 11/025 250/226 |
| 5,371,358 | A * | 12/1994 | Chang | G01C 11/025 250/226 |
| 5,394,237 | A * | 2/1995 | Chang | G01J 3/02 250/339.02 |
| 5,471,056 | A * | 11/1995 | Prelat | G01V 8/02 250/252.1 |
| 6,018,587 | A * | 1/2000 | Cabib | G01J 3/12 382/165 |
| 6,678,048 | B1 * | 1/2004 | Rienstra | G01J 3/2803 356/419 |
| 6,853,452 | B1 * | 2/2005 | Laufer | G01N 21/3504 356/436 |
| 7,126,682 | B2 | 10/2006 | Rowe et al. | |
| 7,592,608 | B2 | 9/2009 | Shakespeare et al. | |
| 7,606,484 | B1 | 10/2009 | Richards et al. | |
| 7,634,157 | B1 | 12/2009 | Richards et al. | |
| 8,049,892 | B2 | 11/2011 | Shakespeare et al. | |
| 8,159,668 | B2 * | 4/2012 | Malinen | G01J 3/2803 356/326 |
| 8,896,839 | B2 | 11/2014 | Saptari | |
| 9,121,760 | B2 | 9/2015 | Cabib et al. | |
| 2004/0259234 | A1 * | 12/2004 | Chou | G01J 3/443 435/287.1 |
| 2005/0104771 | A1 * | 5/2005 | Terry | G01J 3/2823 342/195 |
| 2006/0072109 | A1 * | 4/2006 | Bodkin | G01J 3/0286 356/328 |
| 2008/0259340 | A1 * | 10/2008 | Prasad | G01S 17/95 356/437 |
| 2009/0055102 | A1 * | 2/2009 | Laufer | G01N 21/3504 702/24 |
| 2009/0184257 | A1 * | 7/2009 | Shakespeare | G01J 3/36 250/459.1 |
| 2009/0185185 | A1 * | 7/2009 | Shakespeare | G01J 3/36 356/406 |
| 2010/0284005 | A1 * | 11/2010 | Malinen | G01J 3/02 356/326 |
| 2014/0022549 | A1 * | 1/2014 | Ozeki | G01J 3/021 356/416 |
| 2014/0312212 | A1 * | 10/2014 | Schappacher | G01N 21/6452 250/225 |
| 2019/0182441 | A1 * | 6/2019 | Saleh | H04N 5/332 |

OTHER PUBLICATIONS

Wan et al., Compact characterization of liquid absorption and emission spectra using linear variable filters integrated with a CMOS imaging camera, article, Jul. 8, I 2016, U.S.

Kaushik et al., A two dimensional array of optical interference filters produced by lithographic alterations of the index of refraction, 1995, filters produced United States.

Rao at al., Effect of Atmospheric Transmission and Radiance on Aircraft Infrared Signatures, Aug. 2005, India.

* cited by examiner

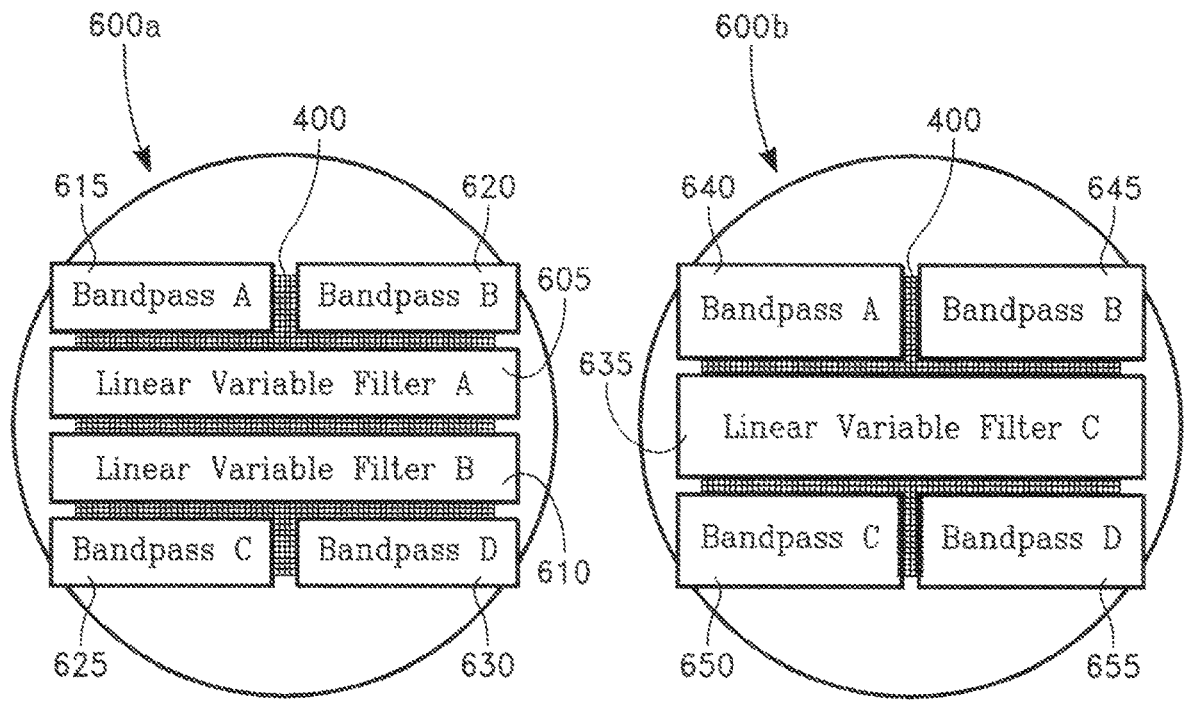
FIG. 6A
FIG. 6B
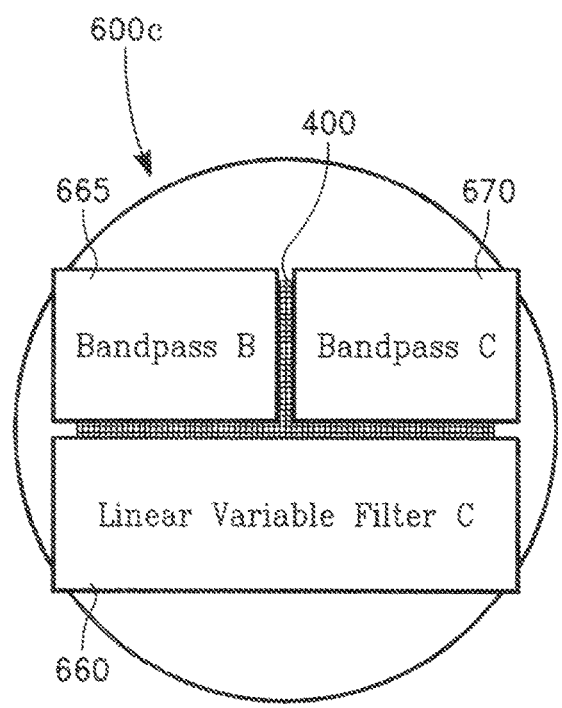
FIG. 6C

US 11,099,077 B1

BACKGROUND SUBTRACTED SPECTROMETER FOR AIRBORNE INFRARED RADIOMETRY

STATEMENT REGARDING FEDERALLY SPONSORED RESEARCH OR DEVELOPMENT

The invention disclosed herein may be manufactured and used by or for the government of the United States of America for governmental purposes without the payment of any royalties thereon or therefor.

FIELD OF USE

The present disclosure relates generally to infrared spectrometers, and more particularly, to background subtracted spectrometers used for airborne infrared radiometry.

BACKGROUND

Infrared radiation emitted by aircraft may be measured by a spectrometer, which is an instrument used for measuring the intensity of radiation as a function of wavelength or frequency within a region of the electromagnetic spectrum. Because the intensity of light at different wavelengths carries specific information about the light source, spectrometers may have various applications. Spectrometers, for example, may be designed to detect airborne targets emitting infrared radiation.

For military applications, many of these infrared measurements must be captured airborne, thereby subjecting the equipment to ambient mechanical vibrations. These shocks and vibrations may cause excessive wear onto the electronic equipment and thus may create reliability issues. As a result, devices with movable components such as a circular variable filter may be more prone to equipment malfunction or mechanical failure. A circular variable filter located at the image plane in the optical train, for instance, may result with spectral shift as target position in the field-of-view changes. These spectrometers may also be subject to natural background radiation sources, leading to a lack spectral stability.

Importantly, circular variable filters have additional limitations associated with its spectral scanning. The spectral scanning of circular variable filters can only change in a continuous manner. Thus, when gathering electromagnetic radiation, including infrared radiation, from multiple, distinct, and non-uniformly spaced spectral bands, rapidly increasing or decreasing sources of electromagnetic radiation may skew the spectral measurements. Furthermore, circular variable filters may also prevent a user from selecting a desired spectral band instantaneously unless the spectral measurements are collimated across the desired channels.

Therefore, based on the foregoing, a new and improved spectrometer for airborne infrared radiometry is needed to overcome these deficiencies.

SUMMARY OF ILLUSTRATIVE EMBODIMENTS

To minimize the limitations in the related art and other limitations that will become apparent upon reading and understanding the present specification, the following discloses a new and useful background subtracted spectrometer for airborne infrared radiometry.

One embodiment may be a background subtracted spectrometer for airborne infrared radiometry, comprising: a filter array configured to selectively pass a plurality of different spectral bands of infrared radiation, the filter array comprising: a linear variable filter, a plurality of bandpass filters, and a detector comprising a focal plane array configured to receive the plurality of different spectral bands of infrared radiation simultaneously transmitted through the filter array, the detector being configured to generate one or more electrical signals indicative of infrared radiation intensity as a function of wavelength; wherein the filter array may be coupled to the focal plane array of the detector. The linear variable filter may be adapted to selectively pass a first spectral band for wavelengths in the range from about 1.5 to about 3.0 μm. The plurality of bandpass filters may comprise: a first bandpass filter adapted to selectively pass a second spectral band for wavelengths in the range from about 2.0 to 2.5 μm; and a second bandpass filter adapted to selectively pass a third spectral band for wavelengths in the range from about 3.5 to 3.9 μm. The first bandpass filter and the second bandpass filter may be arranged in a first row on the focal plane array; and wherein the linear variable filter may be arranged in a second row on the focal plane array. The filter array is preferably not a circular-variable filter; and wherein the spectrometer preferably lacks a relay lens. The background subtracted spectrometer may further comprise: a dewar containing liquid nitrogen, wherein the filter array and the detector may be conductively cooled by the liquid nitrogen.

Another embodiment may be a background subtracted spectrometer for airborne infrared radiometry, comprising: a filter array configured to selectively pass a plurality of different spectral bands of infrared radiation, the filter array comprising: a linear variable filter, a first plurality of bandpass filters, a second plurality of bandpass filters, and a detector comprising a focal plane array configured to receive the plurality of different spectral bands of infrared radiation simultaneously transmitted through the filter array, the detector being configured to generate one or more electrical signals indicative of infrared radiation intensity as a function of wavelength; wherein the filter array may be coupled to the focal plane array of the detector. The linear variable filter may be adapted to selectively pass a first spectral band for wavelengths in the range from about 1.5 to about 3.0 μm. The first plurality of bandpass filters may comprise: a first bandpass filter adapted to selectively pass a second spectral band for wavelengths in the range from about 1.5 to 1.7 μm; and a second bandpass filter adapted to selectively pass a third spectral band for wavelengths in the range from about 2.0 to 2.5 μm. The second plurality of bandpass filters may comprise: a third bandpass filter adapted to selectively pass a fourth spectral band for wavelengths in the range from about 3.5 to 3.9 μm; and a fourth bandpass filter adapted to selectively pass a fifth spectral band for wavelengths in the range from about 4.7 to 4.9 μm. The first plurality of bandpass filters may be arranged in a first row on the focal plane array; wherein the linear variable filter may be arranged in a second row on the focal plane array; and wherein the second plurality of bandpass filters may be arranged in a third row on the focal plane array. The filter array is preferably not a circular-variable filter; and wherein the spectrometer preferably lacks a relay lens. The background subtracted spectrometer may further comprise: a dewar containing liquid nitrogen, wherein the filter array and the detector may be conductively cooled by the liquid nitrogen.

Another embodiment may be a background subtracted spectrometer for airborne infrared radiometry; comprising: a filter array configured to selectively pass a plurality of different spectral bands of infrared radiation, the filter array comprising: a first linear variable filter, a second linear variable filter, a first plurality of bandpass filters, a second plurality of bandpass filters, and a detector comprising a focal plane array configured to receive the plurality of different spectral bands of infrared radiation simultaneously transmitted through the filter array, the detector being configured to generate one or more electrical signals indicative of infrared radiation intensity as a function of wavelength; wherein the filter array may be coupled to the focal plane array of the detector. The first linear variable filter may be adapted to selectively pass a first spectral band for wavelengths in the range from about 1.5 to about 3.0 μm. The second linear variable filter may be adapted to selectively pass a second spectral band for wavelengths in the range from about 3.0 to about 5.0 μm. The first plurality of bandpass filters may comprise: a first bandpass filter adapted to selectively pass a third spectral band for wavelengths in the range from about 1.5 to 1.7 μm; a second bandpass filter adapted to selectively pass a fourth spectral band for wavelengths in the range from about 2.0 to 2.5 μm; and wherein the second plurality of bandpass filters may comprise: a third bandpass filter adapted to selectively pass a fifth spectral band for wavelengths in the range from about 3.5 to 3.9 μm; and a fourth bandpass filter adapted to selectively pass a sixth spectral band for wavelengths in the range from about 4.7 to 4.9 μm. The first plurality of bandpass filters may be arranged in a first row on the focal plane array; wherein the first linear variable filter may be arranged in a second row on the focal plane array; wherein the second linear variable filter may be arranged in a third row on the focal plane array; and wherein the second plurality of bandpass filters may be arranged in a fourth row on the focal plane array. The filter array is preferably not a circular-variable filter; and wherein the spectrometer preferably lacks a relay lens. The background subtracted spectrometer may further comprise: a dewar containing liquid nitrogen; wherein the filter array and the detector may be conductively cooled by the liquid nitrogen.

It is an object to provide a ruggedized, background subtracted spectrometer for obtaining infrared measurements of spectral emissions emanating from aircraft and countermeasure devices. The background subtracted spectrometer preferably lacks a motor-driven circular variable filter, which is generally susceptible to equipment malfunction due to shocks and vibrations from the aircraft. Rather, the circular variable filter is preferably replaced with a filter array lacking movable parts and comprising at least one linear variable filter and a plurality of bandpass filters. In this manner, spectral scanning may be performed electronically rather than mechanically.

It is an object to provide a background subtracted spectrometer utilizing a dewar containing liquid nitrogen. The detector and filter array are preferably conductively cooled by the liquid nitrogen from the dewar in order to maintain a constant temperature of 77° K. This may help reduce direct spectral emissions on the filter array, thereby improving signal-to-noise ratio and thermal stability.

It is an object to provide a background subtracted spectrometer adapted to detect spectral emissions in the 1.5 to 5.5 μm range for airborne infrared radiometry. The background subtracted spectrometer preferably offers improved spectral stability, greater sensitivity, and better field-of-view uniformity.

It is an object to provide a background subtracted spectrometer that is simple, rugged, and robust with a minimal number of components. Preferably, the background subtracted spectrometer increases signal-to-noise ratio and optimizes optical throughput.

It is an object to overcome the limitations of the prior art.

These, as well as other components, steps, features, objects, benefits, and advantages, will now become clear from a review of the following detailed description of illustrative embodiments, the accompanying drawings, and the claims.

BRIEF DESCRIPTION OF THE DRAWINGS

Some of the drawings are illustrative embodiments of the background subtracted spectrometer for airborne infrared radiometry. The drawings do not illustrate all embodiments and do not set forth all embodiments. Other embodiments may be used in addition or instead. Details, which may be apparent or unnecessary, may be omitted to save space or for more effective illustration. Some embodiments may be practiced with additional components or steps and/or without all of the components or steps, which are illustrated. When the same numeral appears in different drawings, it is intended to refer to the same or like components or steps.

FIGS. 6A to 6C are various embodiments of the filter array for the background subtracted spectrometer, according to the present disclosure.

DETAILED DESCRIPTION OF ILLUSTRATIVE EMBODIMENTS

In the following detailed description, numerous specific details are set forth in order to provide a thorough understanding of various aspects of one or more embodiments of the background subtracted spectrometer for airborne infrared radiometry. However, these embodiments may be practiced without some or all of these specific details. In other instances, well-known methods, procedures, and/or components have not been described in detail so as not to unnecessarily obscure aspects of these embodiments.

While multiple embodiments of the background subtracted spectrometer are disclosed, still other embodiments will become apparent to those skilled in the art from the following detailed description. As will be realized, the following embodiments may be capable of modifications in various obvious aspects, all without departing from the spirit and scope of protection. Accordingly, the graphs, figures, and the detailed descriptions thereof, are to be regarded as illustrative in nature and not restrictive. Also, the reference or non-reference to a particular embodiment shall not be interpreted to limit the scope of the disclosure.

Before the embodiments of the background subtracted spectrometer are disclosed and described, it is to be understood that this these embodiments are not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment", "an embodiment", or "another embodiment" may mean that a particular feature, structure, or characteristic described in connection with the embodiment may be included in at least one embodiment of the present disclosure. Thus, appearances of the phrases "in one embodiment" or "in an embodiment" in various places throughout this specification may not necessarily refer to the same embodiment.

Furthermore, the described features, structures, or characteristics may be combined in any suitable manner in one or more embodiments. In the following description, numerous specific details are provided, such as examples of materials, fasteners, sizes, lengths, widths, and shapes to provide a thorough understanding of the embodiments. One skilled in the relevant art will recognize, however, that the scope of protection can be practiced without one or more of the specific details, or with other methods, components, and materials. In other instances, well-known structures, materials, or operations are generally not shown or described in detail to avoid obscuring aspects of the disclosure.

Figure 1:
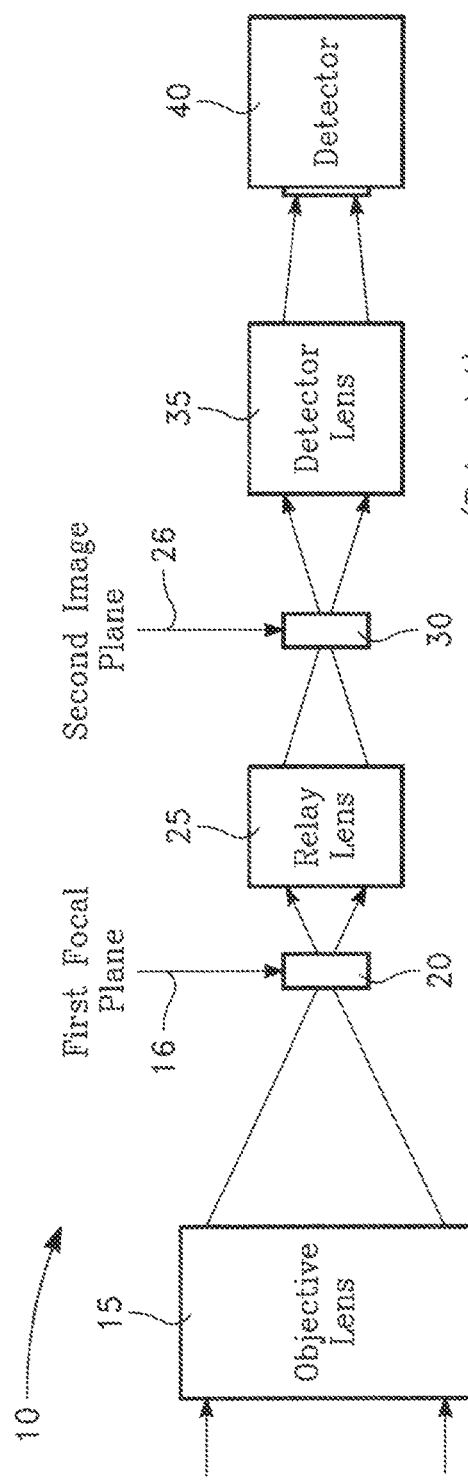
FIG. 1 is a block diagram of a conventional background subtracted spectrometer used for airborne infrared radiometry.

Finally, the mention herein of any conventional background subtracted spectrometer, for example, in the Background section or FIG. 1 is not an admission that the background subtracted spectrometer serves as prior art with respect to any of the claims presented herein. The Background section and FIG. 1 are presented for purposes of clarity and is not meant as a description of prior art with respect to any claim.

Definitions

In the following description, certain terminology is used to describe certain features of the embodiments of the background subtracted spectrometer. For example, as used herein, unless otherwise specified, the term "substantially" refers to the complete, or nearly complete, extent or degree of an action, characteristic, property, state, structure, item, or result. As an arbitrary example, an object that is "substantially" surrounded would mean that the object is either completely surrounded or nearly completely surrounded. The exact allowable degree of deviation from absolute completeness may in some cases depend on the specific context. However, generally speaking, the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. As another arbitrary example, a composition that is "substantially free of" particles would mean either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "approximately" generally refers to the actual value being within a range, e.g. 10%, of the indicated value. The meaning of other terminology used herein should be easily understood by someone of reasonable skill in the art.

As used herein, the term "about" is used to provide flexibility to a numerical range endpoint by providing that a given value may be "a little above" or "a little below" the endpoint. In some cases, the term "about" is to include a range of not more than 10% of the indicated value.

As used herein, the term "electromagnetic radiation" refers to radiation or energy in the form of visible, ultraviolet, infrared radiation, or near infrared radiation.

As used herein, the term "infrared" refers to electromagnetic radiation or energy having a wavelength longer than visible radiation and shorter than microwave radiation. The numerical wavelength range of the infrared spectrum is usually considered to extend from 0.7 μm, which is the longest visible wavelength to approximately 1000 μm.

As used herein, the term "emissivity" refers to the ratio of the energy radiated from a material's surface to that radiated from a black body at the same temperature and wavelength and under the same viewing conditions. Black bodies function as ideal radiators, emitting all energy, offering high power, and wide spectral range at good efficiency. Gray bodies, on the other hand, are non-ideal, emitting energy in a selective manner and at less energy at any given wavelength than a black body emitter.

As used herein, the term "focal plane array" refers to an image sensing device, comprising an array (typically rectangular) of light-sensing pixels at the focal plane of a lens.

As used herein, the term "bandpass filter" refers to a bandpass dielectric filter that passes electromagnetic radiation with wavelengths within a certain range and rejects (attenuates) electromagnetic radiation with wavelengths outside that range.

As used herein, the term "linear variable filter" refers to a bandpass dielectric filter whose properties vary over its length such that the central wavelength of the pass band varies linearly across the filter. The linear variable filter generally transitions in its filtering function, allowing electromagnetic radiation in one spectral band to pass in one area of the linear variable filter and allowing electromagnetic radiation in another spectral band to pass in a different area of the linear variable filter.

As used herein, the terms "conductively cooled" and "conductive cooling" refer to a method of using thermally conductive material to transfer heat from the filter array or detector to a cold wall or heatsink via liquid nitrogen stored in a dewar.

Finally, the term "Planck's Law" describes the amount of electromagnetic radiation emitted by a black body in thermal equilibrium at a definite temperature. Importantly, Planck's Law also governs the intensity of radiation emitted by a unit surface area in a fixed direction as a function of wavelength and temperature. Planck's Law may be expressed by the following equation:

$$W_{\lambda b} = \frac{2\pi hc^2}{\lambda^5 \left(e^{\frac{hc}{\lambda kT}} - 1\right)} \times 10^{-6}$$

where $W_{\lambda b}$ is the black body spectral radiant emittance at wavelength).
c=3×1010 ern/sec$^{-27}$ (speed of light)
h=6.625×10$^{-27}$ erg/sec (Planck's constant)
k=1.38×10$^{-16}$ erg/K (Boltzmann's constant)
T=temperature in degrees Kelvin of the black body
λ=wavelength in microns Planck's Law may be used to depict a distribution of wavelength versus intensity at a given temperature, and the distribution generally shows a peak at a certain wavelength. Planck's Law also shows that as the temperature rises, the peak shifts to shorter wavelengths and the area under the curve beneath the peak expands.

As used herein in this disclosure, the singular forms "a" and "the" may include plural referents, unless the context clearly dictates otherwise. Thus, for example, reference to an "insert" can include reference to one or more of such inserts.

The present disclosure relates generally to background subtracted spectrometers used for airborne infrared radiometry and designed to operate reliably in harsh environments. In particular, military infrared technology generally involves obtaining accurate infrared measurements for electronic warfare applications. Infrared radiation (IR) is electromagnetic radiation with wavelengths longer than those of visible light but shorter than microwaves. IR is also usually in the mid-wavelength range of 1.5 to 5.5 μm. In general, the higher the temperature of a material, the stronger the radiation and usually the shorter the wavelength of the peak power emitted, Thus, infrared measurements obtained from airborne infrared radiometry for military applications are generally based on the spectral emissions emanating from aircrafts and countermeasure devices.

Many of these infrared measurements must be captured airborne, thereby subjecting the spectroscopy equipment to ambient mechanical vibrations, resulting with possible reliability issues. Shocks and vibrations encountered by the aircraft, for instance, may cause excessive wear to the electronic equipment by deforming or fracturing enclosures and internal support structures. Devices with movable components such as a circular variable filter may also be more susceptible to equipment failure due to its rotating parts.

Importantly, circular variable filters have additional limitations associated with its spectral scanning. The spectral scanning of circular variable filters can only change in a continuous manner. Thus, when gathering electromagnetic radiation, including infrared radiation, from multiple, distinct, and non-uniformly spaced spectral bands, rapidly increasing or decreasing sources of electromagnetic radiation may skew the spectral measurements. Furthermore, circular variable filters may also prevent a user from selecting a desired spectral band instantaneously unless the spectral measurements are collimated across the desired channels.

Accordingly, the embodiments of the background subtracted spectrometer disclosed herein solve these problems. The circular variable filter is preferably replaced with a filter array lacking movable parts and having at least one linear variable filter and multiple bandpass filters. This will preferably allow spectral scanning to be performed electronically rather than mechanically. Importantly, the filter array and detector may be conductively cooled by liquid nitrogen stored in a dewar, which will preferably help reduce direct emissions from the filter array, thereby improving signal-to-noise ratio. The dewar may also help maintain a constant temperature while improving thermal and spectral stability. As a result, the operator may obtain a better field-of-view uniformity.

Although embodiments of the present disclosure are described in considerable detail, including references to certain versions thereof, other versions are possible such as, for example, orienting and/or attaching components in a different fashion. Therefore, the spirit and scope of the appended claims should not be limited to the description of versions included herein.

In the accompanying drawings, like reference numbers indicate like elements. Reference character 100 generally refers to a background subtracted spectrometer for airborne infrared radiometry, according to some embodiments of the present disclosure. The background subtracted spectrometer may be sometimes simply referred to as "spectrometer". Other variations, of course, are possible without deviating from the merits or generalities of the embodiments disclosed herein.

FIG. 1 is a block diagram of a conventional background subtracted spectrometer used for airborne infrared radiometry. In general, the background subtracted spectrometer 10 is mounted in a known airborne platform (not shown) and is particularly suitable for operating in the mid-wavelength infrared spectra region. As shown in FIG. 1, the conventional background subtracted spectrometer 10 includes: an objective lens 15, chopper 20, relay lens 25, circular variable filter 30, detector lens 35, and detector 40. The objective lens 15 is a transmissive optical device that collects electromagnetic radiation emitted or reflected from a target. The objective lens 15 focuses or disperses the electromagnetic radiation towards a first focal plane 16, and there, becomes modulated (i.e., interrupts at regular intervals) by a mechanically rotating chopper 20. The chopper 20, which is generally well-known in the art, modulates the electromagnetic radiation by alternately providing a sharply focused image and a blurred or scattered image as a background reference. This is usually achieved by utilizing a spinning partial-field-of-view chopper blade and field stop. After modulation, the electromagnetic radiation is then collected by the relay lens 25 and refocused onto a second image plane 26 for filtering by the circular variable filter 30. In this manner, the electromagnetic radiation may be defined and filtered as one or more spectral bands and regions of the electromagnetic radiation. After filtering of the electromagnetic radiation, the radiation is collected by the detector lens 35 and spread uniformly over the detector 40. The detector 40, which generally consists of a single detector element, then converts the electromagnetic radiation into an electric signal. There, the electric signal is then decoded by a digital signal processor or microprocessor to provide measures of radiometric interest.

The above background subtracted spectrometer 10 is fragile due to the mechanical properties of the circular variable filter 30. Shocks and ambient mechanical vibrations encountered by the aircraft while airborne may cause excessive wear to the circular variable filter 30, resulting with equipment malfunction or mechanical failure. Additionally, the circular variable filter 30 and relay lens 25 may also be subject to natural background radiation sources, thereby lacking spectral stability and adequate signal-to-noise ratio.

Figure 2:
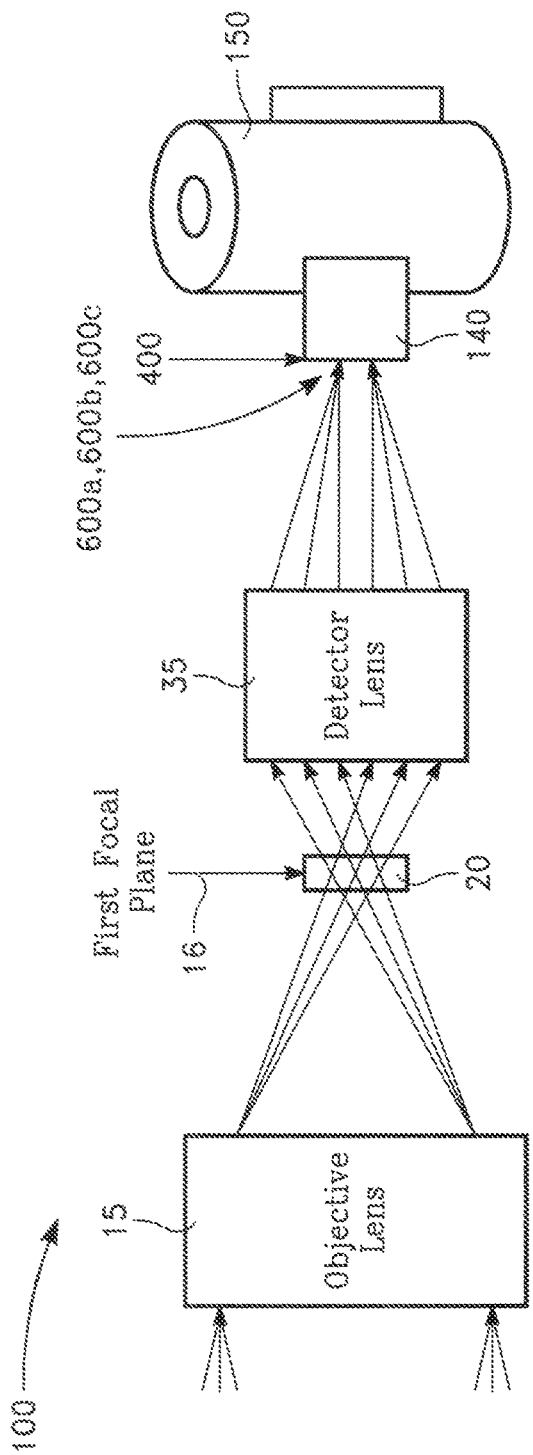
FIG. 2 is a block diagram of one embodiment of the new and improved background subtracted spectrometer for airborne infrared radiometry, according to the present disclosure.

FIG. 2 is a block diagram of one embodiment of the new and improved background subtracted spectrometer for airborne infrared radiometry, according to the present disclosure. As shown in FIG. 2, one embodiment of the new and improved background subtracted spectrometer 100 may comprise: an objective lens 15, chopper 20, detector lens 35, filter array 600$a$, 600$b$, 600$e$ (shown in FIGS. 6A to 6C), detector 140, and dewar 150. As recited above, the objective lens 15 may collect electromagnetic radiation emitted from or reflected off a target and may focus or disperse that electromagnetic radiation towards a first focal plane 16. There, the electromagnetic radiation may be modulated via the chopper 20 by alternately providing a sharply focused image and a blurred or scattered image as a background reference.

In particular, electromagnetic radiation from the objective lens 15 may pass through the optical window of the chopper 20, and upon incident of the partial-field-of-view chopper blade of the chopper 20, the electromagnetic radiation may be periodically modulated. The chopper blade may be rotating at a fixed speed, driven by a precision electric motor, and due to this rotation, the chopper blade may be periodically aligned/misaligned with the incident radiation. In this manner, periodic passage of the electromagnetic radiation may occur, resulting with periodic modulation of the incident radiation.

Unlike the conventional background subtracted spectrometer 10 depicted in FIG. 1, FIG. 2 shows that the new and improved background subtracted spectrometer 100 lacks a relay lens 25. As a result, the modulated electromagnetic radiation passing through the chopper 20 may directly transfer onto the detector lens 35. There, the electromagnetic radiation may be refocused onto the filter array 600$a$, 600$b$, 600$c$, which filters the electromagnetic radiation into different spectral bands.

In various embodiments, each filter array 600$a$, 600$b$, 600$c$ may comprise one or more linear variable filters and one or more bandpass filters. For example, in one embodiment, the filter array 600$a$ (shown in FIG. 6A) may comprise two linear variable filters 605, 610—one for filtering segments of radiation having wavelengths in the range from about 1.5 to about 3.0 μm, and the other for filtering segments of radiation having wavelengths in the range from about 3.0 to about 5.0 μm. That same embodiment of the filter array 600$a$ may also comprise four bandpass filters 615, 620, 625, 630 for filtering segments of radiation for the following wavelengths: (1) 1.5 to 1.7 μm: (2) 2.0 to 2.5 μm; (3) 3.5 to 3.9 μm; and (4) 4.7 to 4.9 μm. Additional details about this embodiment of the filter array 600$a$ is explained below in FIG. 6A.

Each portion of the electromagnetic radiation emission that traverses through the linear variable filters and bandpass filters of the filter array 600$a$, 600$b$, 600$c$ may be focused on the focal plane array 400 of the detector 140. The focal plane array 400 may be a two dimensional arrangement comprising a plurality of detector elements, each constituting a single pixel of the detector 140. Importantly, the focal plane array 400 may be capable of measuring an intensity of electromagnetic radiation in various wavelength bands provided by the filter array 600$a$, 600$b$, 600$c$. Each detector element may also measure the intensity of electromagnetic radiation provided in one of the wavelength bands. In operation, each detector element may simultaneously generate an electrical signal, indicative to the incident radiation focused thereupon. In this manner, the electrical signals may provide information regarding the intensity and location of the electromagnetic radiation emission from the airborne targets. The quality of the electrical signals to identify targets in terms of spectral resolution may depend on detector elements having good signal-to-noise ratios. Preferably, the filter array 600$a$, 600$b$, 600$c$ and detector 40 are conductively cooled by the liquid-nitrogen dewar 150 to provide greater thermal stability.

In some embodiments, the detector 140 may comprise a controller (not shown) for controlling the operation of the detector 140. The controller, for example, may cause the detector 140 to initiate or halt measuring of infrared radiation transversing through the filter array 600$a$, 600$b$, 600$c$. The controller may also receive and provide infrared radiation measurement data to an external device or component such as a digital signal processor or computer. Thus, the controller may be capable of performing any other or additional actions to facilitate operation of the detector 140.

Typical embodiments of the detector 140 and detector elements may also depend upon a number of design considerations which vary according to the proposed application of the background subtracted spectrometer 100. Such design considerations may include, without limitation: cost, desired field of view, spatial resolution, and frame speed. In one embodiment, the detector 140 may be a two dimensional array detector having pixels that operate simultaneously. In various embodiments, the detector 140 may utilize time delay and signal integration techniques over a relatively long fixed period of time in order to improve signal-to-noise ratios while still maintaining an adequate frame rate.

Additionally, known processing techniques are generally used for processing the electrical signals corresponding to the spectral measurements. The background subtracted spectrometer 100, for instance, may be operatively coupled to a computer for collecting the electrical signals from the detector 140. The computer generally comprises basic components of a processor, memory for storing data, software, and input/output devices (e.g., display, data recorder, data storage) and may receive electrical data from the background subtracted spectrometer 100 in order to relate the scanned spectral data to the airborne targets.

Importantly, unlike the conventional background subtracted spectrometer 10 shown in FIG. 1, the background subtracted spectrometer 100, according to the present disclosure in FIG. 2, eliminates the relay lens 25 and circular variable filter 30. Elimination of the relay lens 25 preferably increases the spectral transmission and consequently the sensitivity of the background subtracted spectrometer 100. Elimination of the motor-driven circular variable filter 30, on the other hand, may also benefit by removing a high-failure rate component and a source of wavelength uncertainty. Thus, the circular variable filter 30 may be replaced with a filter array 600$a$, 600$b$, 600$c$ having, at least one infrared linear variable filter and multiple bandpass filters, all of which may be coupled or bonded to the focal plane array 400 of the detector 140. In various embodiments, the filter array 600*a*, 600*b*, 600*c*, detector lens 35, and/or chopper 20 may need to be repositioned in order to adjust and obtain accurate spectral measurements. The filter array 600*a*, 600*b*, 600*c* and detector 40 may also be conductively cooled by the dewar 150 containing liquid nitrogen.

Additionally, by replacing the circular variable filter 30 with the filter array 600*a*, 600*b*, 600*c*, spectral scanning may be achieved electronically rather than mechanically in order to improve reliability. The detector lens 35 may also spread the incident radiation uniformly across the filter array 600*a*, 600*b*, 600*c* and focal plane array 400 without spectral shift caused by the changes in target position in the field of view. Conductively cooling the filter array 600*a*, 600*b*, 600*c* and the detector 140 within the liquid-nitrogen dewar 150 preferably reduces direct emissions from the filter array 600*a*, 600*b*, 600*c* (so as not to introduce noise and spurious signals) and generally provides greater thermal stability and lower noise than the uncooled circular variable filter 30.

Notably, one restrictive feature of the circular variable filter 30 is that the pass-band can change only in a continuous manner across the chopper blade. Thus, when trying to obtain electromagnetic radiation, including infrared radiation, from multiple, distinct, and non-uniformly spaced spectral bands, it is usually disadvantageous to utilize a single variable filter such as the circular variable filter 30. The circular variable filter 30 may also prevent a user to pick and choose a desired spectral band instantaneously unless the spectral measurements are collimated across the desired channels. Thus, the new and improved background subtracted spectrometer 100, which comprises a filter array 600*a*, 600*b*, 600*c*, is well suited for extremely rapid data collection, especially if the desired channels are widely spaced throughout the spectrum.

Figure 3:
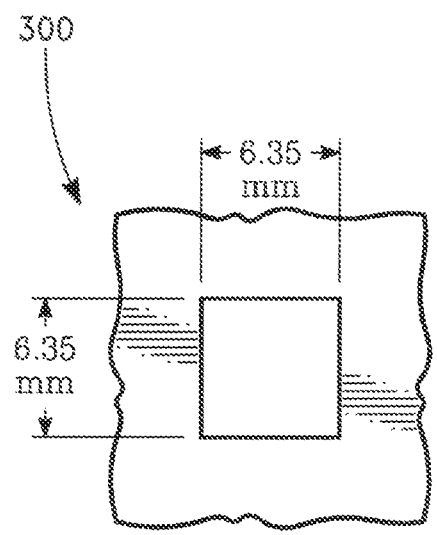
FIG. 3 is an illustration of one embodiment of the chopper aperture for the background subtracted spectrometer, according to the present disclosure.

FIG. 3 is an illustration of one embodiment of the chopper aperture for the background subtracted spectrometer, according to the present disclosure. The chopper aperture 300 is generally configured to admit electromagnetic radiation periodically and may focus the modulated electromagnetic energy spectrum on a suitable surface, which may be the detector lens 35. The chopper aperture 300 may then be used in conjunction with a filter array 600*a*, 600*b*, 600*c*, detector lens 35, and a detector 140 to sequentially produce electromagnetic radiation of varying wavelengths. Importantly, FIG. 3 shows that one embodiment of the chopper aperture 300 may be dimensioned to approximately 0.25× 0.25 inches (or 6.35×6.35 millimeters), which may be smaller than the focal plane array 400 of the detector 40. The dimensions of the chopper aperture 300 are generally important not because of the relation with the focal plane array 400, but because the chopper aperture 300 may define the field stop, and thus the design field of view.

Figure 4:
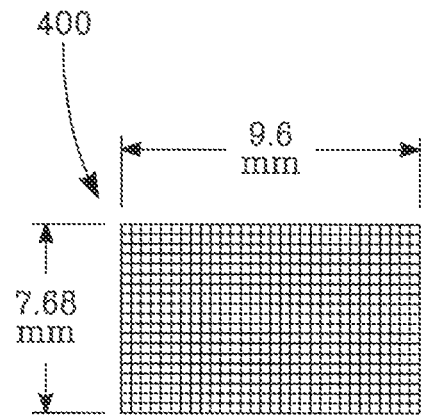
FIG. 4 is an illustration of one embodiment of the focal plane array used for the background subtracted spectrometer, according to the present disclosure.

FIG. 4 is an illustration of one embodiment of the focal plane array used for the background subtracted spectrometer, according to the present disclosure. As discussed above, the focal plane array 400 shall be an image sensing component, comprising an array of detector elements. The focal plane array 400 preferably receives the electromagnetic radiation filtered by the filter array 600*a*, 600*b*, 600*c*, and the electromagnetic radiation may be divided into different spectral bands. Preferably, the filtered electromagnetic radiation is infrared radiation that is spread uniformly over the focal plane array 400. As shown in FIG. 4, one embodiment of the focal plane array 400 may be dimensioned to approximately 7.68×9.6 millimeters (12.29 millimeters diagonal).

Figure 5:
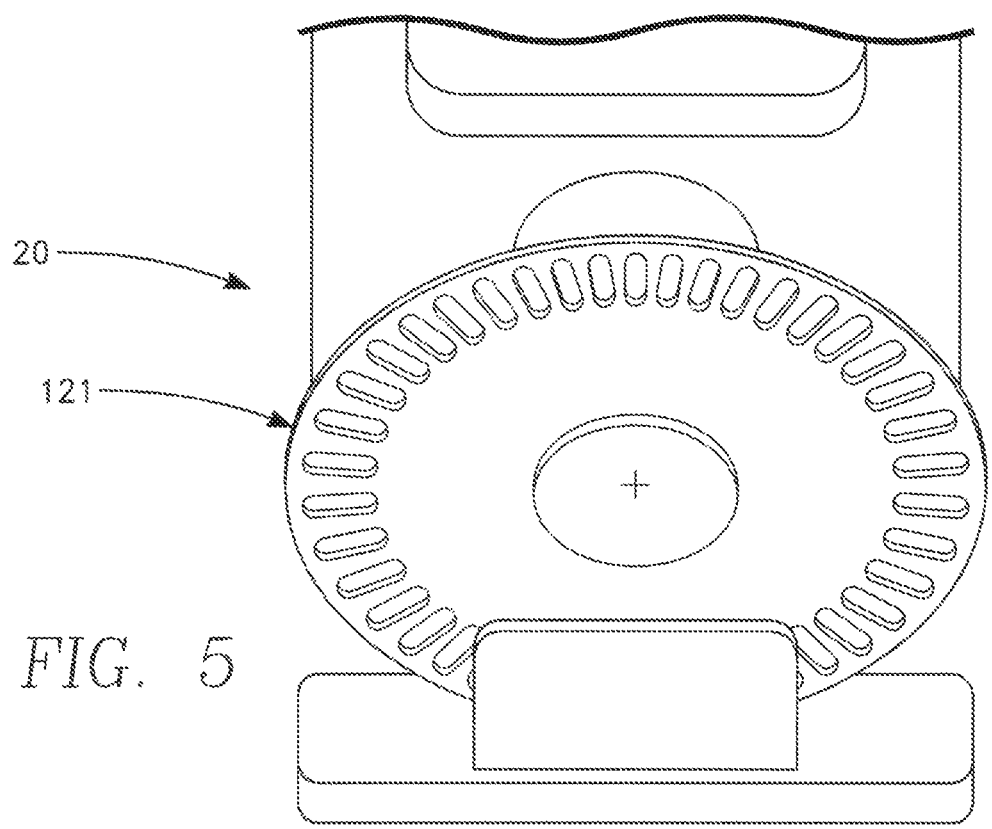
FIG. 5 is one embodiment of the chopper used for the background subtracted spectrometer for airborne infrared radiometry, according to the present disclosure.

FIG. 5 is one embodiment of the chopper used for the background subtracted spectrometer for airborne infrared radiometry, according to the present disclosure. As recited above, the background subtracted spectrometer 100, according to the present disclosure, may utilize the existing chopper 20 having a chopper blade 121 or wheel. The chopper blade 121 may be driven by a precision electric motor and may be disposed within the path of radiation emission from the objective lens to the filter array 600*a*, 600*b*. 600*c*. The chopper blade 121 may also be used to create spatial filtering to automatically subtract background by distinguishing targets subtending small angles from extending targets such as sunlit clouds or terrain. Thus, by driving the chopper blade 121 at a fixed rotation speed, the chopper 20 may also modulate the radiation emission upon the detector 140 at regular intervals. In this manner, each detector element may operate below its saturation point, thus improving the quantum efficiency of the detector 140 and improving signal-to-noise ratios.

Regarding frequency and sampling, digital reconstruction based on the Nyquist rate requires that the sampling rate be at least twice the chopping frequency. Therefore, the integration time for each focal plane array pixel is preferably $<2/\text{frequency}_{CHOPPER}$. In addition to faster integration time, a corresponding frame rate of a focal plane array, $>2\times\text{frequency}_{CHOPPER}$, is generally needed to reconstruct the target waveform at the chopping frequency. Infrared imagers with fast focal plane array integration typically should be chosen to accommodate desired chopping frequencies greater than 500 Hz. A tradeoff of focal plane array size, detector pixel pitch, and detector efficiency usually should occur to select a fast, sensitive focal plane with sufficient pixels to obtain spectral resolution. Although the dynamic range of the detector may greatly reduce, these frequency requirements may be achieved.

FIGS. 6A to 6C are various embodiments of the filter array for the background subtracted spectrometer, according to the present disclosure, Due to its various multi-spectral configurations, the proposed filter implementations may promote significantly greater extraction and measurement of target characteristics in the spectral, spatial, and temporal domains. The use of multiple linear variable filters and band pass filters may permit radiometric measurements of the short-wave infrared (SWIR) and mid-wave infrared (MWIR). In some embodiments, the linear variable filter(s) and band pass filter(s) may be integrated on the focal plane array 400 of the detector 140. In other embodiments, the linear variable filter(s) and band pass filter(s) may be attached to the focal plane array 400 of the detector 140. Still, in other embodiments, the linear variable filter(s) and band pass filter(s) may be created or integrated on the focal plane array 400 by applying a suitable coating on the surface of the detector 140.

The embodiments shown in FIGS. 6A to 6C depict three filter arrays 600*a*, 600*b*, 600*c*, which, unlike the circular variable filter, may comprise multiple filter regions, each of which can be individually assigned a different pass-band over a relatively large spectral range. Each filter region may also be aligned with or otherwise associated with one or more pixels or detector elements, and each detector element may be predefined prior to its use. In 1R applications, where information at only a few wavelengths is generally required, a spectrometer based on this type of filter array 600*a*, 600*b*, 600*c* can be made small as the detector elements of the focal plane array 400.

The bandpass filters 615, 620, 625, 630, 640, 645, 650, 655, 665, 670 may be selected and adjusted to optimize electromagnetic transmission in the spectrometer 100. Aspects of the spectrometer 100 that can be optimized by the choice of the filters may include maximizing the spectral regions integral to the measurement being made and reducing electromagnetic noise by eliminating electromagnetic radiation in spectral regions outside the band(s) of interest. The filter array 600a, 600b, 600c may comprise at least one linear variable filter 605, 610, 635, 660 and multiple discrete bandpass filters 615, 620, 625, 630, 640, 645, 650, 655, 665, 670.

Depending on the filter array 600a, 600b, 600c and focal plane array 400 size constraints, various embodiments of the filter array 600a, 600b, 600c may comprise combinations of the bandpass filters 615, 620, 625, 630, 640, 645, 650, 655, 665, 670 and linear variable filters 605, 610, 635, 660 as a two dimensional array. Specifically, various embodiments of the combinations may be arranged over the focal plane array 400, as follows: (1) two linear variable filters 605, 610 with four band pass filters 615, 620, 625, 630 (shown in FIG. 6A), (2) one linear variable filter 635 with four bandpass filters 640, 645, 650, 655 (shown in FIG. 6B), and (3) one linear variable filter 660 with two bandpass filters 665, 670 (shown in FIG. 6C).

In particular, as shown in FIG. 6A, a first embodiment of the filter array 600a may be disposed over the focal plane array 400 and may comprise: a first linear variable filter 605, second linear variable filter 610, a first bandpass filter 615, second bandpass filter 620, third bandpass filter 625, and fourth bandpass filter 630. In this embodiment, the first linear variable filter 605 may be adapted to selectively pass a first spectral band for wavelengths in the range from about 1.5 to about 3.0 μm, whereas the second linear variable filter 610 may be adapted to selectively pass a second spectral band for wavelengths in the range from about 3.0 to about 5.0 μm. In this manner, the background subtracted spectrometer 100 may obtain radiometric measurements in the MWIR.

Still, in this same embodiment shown in FIG. 6A, the first bandpass filter 615 may be adapted to selectively pass a third spectral band for wavelengths in the range from about 1.5 to 1.7 μm. The second bandpass filter 620 may be adapted to selectively pass a fourth spectral band for wavelengths in the range from about 2.0 to 2.5 μm. The third bandpass filter 625 may be adapted to selectively pass a fifth spectral band for wavelengths in the range from about 3.5 to 3.9 μm. The fourth bandpass filter 630 may be adapted to selectively pass a sixth spectral band for wavelengths in the range from about 4.7 to 4.9 μm. The four spectral bands obtained from these four bandpass filter regions 615, 620, 625, 630 may be used to predict the temperature and emissivity based on the radiometric measurements from each of the bandpass filters 615, 620, 625, 630. Additional details in determining temperature based on the bandpass filters are described below.

FIG. 6A shows that the first bandpass filter 615 and second bandpass filter 620 may be arranged in a first row, and that the first linear variable filter 605 may be arranged in a second row. FIG. 6A also shows that the second linear variable filter 610 may be arranged in a third row, and that the third bandpass filter 625 and fourth bandpass filter 630 may be arranged in a fourth row.

In a second embodiment, FIG. 6B shows that the filter array 600b may also be disposed over the focal plane array 400 and may comprise a linear variable filter 635, a first bandpass filter 640, second bandpass filter 645, third bandpass filter 650, and fourth bandpass filter 655. In this embodiment, the first linear variable filter 635 may be adapted to selectively pass a first spectral band for wavelengths in the range from about 1.5 to about 5.0 μm. In this manner, the background subtracted spectrometer 100 may obtain radiometric measurements in the MWIR, but with approximately half the fidelity or accuracy than the first linear variable filter 605 and second linear variable filter 610 combined in the filter array 600a, shown in FIG. 6A.

Still, in this same embodiment shown in FIG. 6B, the first bandpass filter 640 may be adapted to selectively pass a second spectral band for wavelengths in the range from about 1.5 to 1.7 μm. The second bandpass filter 645 may be adapted to selectively pass a third spectral band for wavelengths in the range from about 2.0 to 2.5 μm. The third bandpass filter 650 may be adapted to selectively pass a fourth spectral band for wavelengths in the range from about 3.5 to 3.9 μm. The fourth bandpass filter 655 may be adapted to selectively pass a fifth spectral band for wavelengths in the range from about 4.7 to 4.9 μm. Like the embodiment, shown in FIG. 6A, these four spectral bands obtained from these four bandpass filters 640, 645, 650, 655 may be used to predict the temperature and emissivity based on the radiometric measurements from each of the bandpass filters 640, 645, 650, 655.

FIG. 6B shows that the first bandpass filter 640 and second bandpass filter 645 may be arranged in a first row. FIG. 6B also shows that the first linear variable filter 635 may be arranged in a second row, and that the third bandpass filter 650 and fourth bandpass filter 655 may be arranged in a third row.

In a third embodiment, FIG. 6C shows that the filter array 600c may also be disposed over the focal plane array 400 and may comprise a linear variable filter 660, a first bandpass filter 665, and a second bandpass filter 670. In this embodiment, the first linear variable filter 660 may be adapted to selectively pass a first spectral band for wavelengths in the range from about 1.5 to about 5.0 μm. In this manner, the background subtracted spectrometer 100 may obtain radiometric measurements in the MWIR, but with approximately half the fidelity or accuracy than the first linear variable filter 605 and second linear variable filter 610 combined in the filter array 600a, shown in FIG. 6A.

Additionally, in this same embodiment in FIG. 6C, the first bandpass filter 665 may be adapted to selectively pass a second spectral band for wavelengths in the range from about 2.0 to 2.5 run, whereas the second bandpass filter 670 may be adapted to selectively pass a third spectral band for wavelengths in the range from about 3.5 to 3.9 μm. These two spectral bands obtained from these two bandpass filters 665, 670 may be used to predict the temperature and emissivity based on the radiometric measurements from each of the bandpass filters 665, 670.

Finally, FIG. 6C shows that the first bandpass filter 665 and second bandpass filter 670 may be arranged in a first row, whereas the first linear variable filter 635 may be arranged in a second row.

In a preferred embodiment depicted in FIG. 6A, four bandpass filters 615, 620, 625, 630 may be used. However, less bandpass filters such as two may be incorporated to attain the aforementioned objectives. As discussed above, the bandpass filters 615, 620, 625, 630, 640, 645, 650, 655, 665, 670 may be a well-known type of narrow band filter and are preferably conductively cooled by the dewar, to reduce background radiation and improve signal-to-noise ratios.

Figure 7:
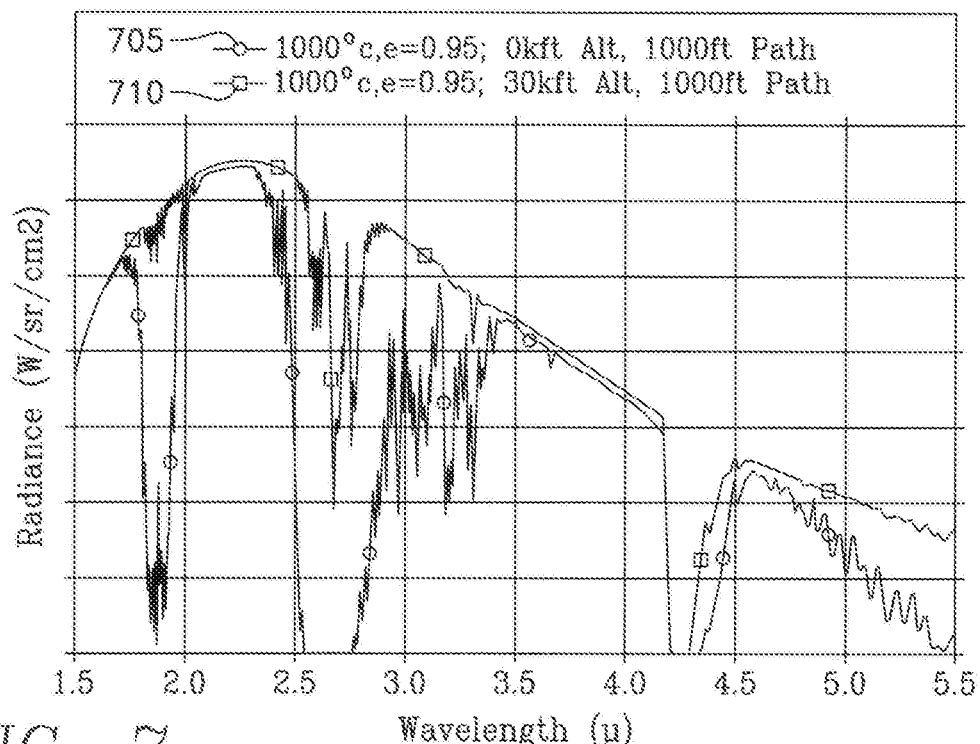
FIG. 7 is a graph depicting the spectral emissions of a single gray body source at two altitudes across the 1.5 to 5.5 μm range.

FIG. 7 is a graph depicting the spectral emissions of a single gray body source at two altitudes across the 1.5 to 5.5 μm range. Specifically, using Planck's Law to define radiance as a function of wavelength, FIG. 7 depicts two gray body curves at 0 feet and 30,000 feet, both of which are exhibiting 95% emissivity for 1,000° C. through a horizontal path of 1,000 feet. Plot 705 shows the relationship between radiance and wavelength emitted from a gray body at an altitude of 0 feet, whereas plot 710 shows the relationship between radiance and wavelength emitted from a gray body at an altitude of 30.000 feet.

Importantly, plots 705, 710 demonstrate that as altitude increases, the transmission increases, allowing more electromagnetic energy across the MWIR spectral region. FIG. 7 also shows that much of the peaks and dips of plots 705, 710 are also within the 1.5 to 5.5 μm spectral region, peaking around 2.3 μm for 1,000° C. Thus, FIG. 7 illustrates the radiometric interest fora linear variable filter having an operating range from about 1.5 to about 5.0 μm.

Notably, the MWIR region, which is about 1.5 to 6.0 μm, is usually of greatest concern to airborne radiometry because most military applications operate in that region. Spectral properties, however, may vary greatly within the MWIR spectral band. For example, towards the short wavelength side of the MWIR spectral region, reflected sunlight from airframe surfaces generally dominates the aircraft appearance. The sky background is generally dominated by scattered sunlight, and the terrain background is generally dominated by direct emissions. On the other hand, aircraft emissions and sky and terrain background generally dominate the mid-to-long wavelength side of the MWIR spectral region.

Figure 8:
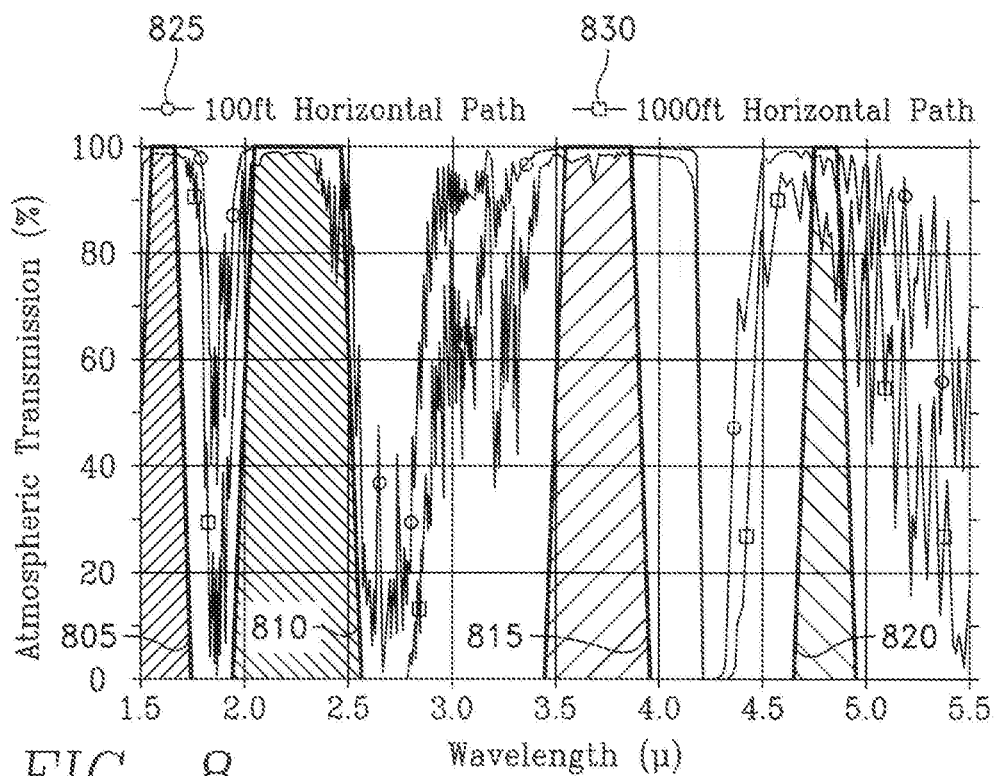
FIG. 8 is a graph depicting the atmospheric transmissions at altitude of 0 feet for two horizontal paths across the 1.5 to 5.5 μm range and depicts the operating regions for four bandpass filters within that spectral range.

FIG. 8 is a graph depicting the atmospheric transmissions at an altitude of 0 feet for two horizontal paths across the 1.5 to 5.5 μm range and depicts the operating regions for four bandpass filters within that spectral range. Specifically, using the U.S. Standard Atmosphere (1976) to define atmospheric transmission as a function of wavelength, FIG. 8 depicts two plots 825, 830 representing horizontal paths at 100 feet and 1,000 feet, respectively, at an altitude of 0 feet. FIG. 8 also depicts four nominal curves 805, 810, 815, 820 superimposed to the two plots 825, 830 and representing the four bandpass filter regions.

In general, choosing bandpass filters for a particular filter array 600a, 600b, 600c is usually based upon those bandpass filters having narrow band properties on regions with good atmospheric windows. Good atmospheric windows are generally regions of the SWIR and MWIR spectrum where the atmospheric transmission is at or near 100%. Thus, according to FIG. 8, the good atmospheric windows within the 1.5 to 5.5 μm range for horizontal paths of 100 feet and 1,000 feet appear to be: (1) from about 1.5 to 1.8 μm, (2) from about 2.0 to 2.5 μm, (3) from about 3.4 to 4.2 μm, and (4) from about 4.6 to 4.8 μm. As such, according to multiple embodiments of the background subtracted spectrometer 100, four bandpass filters 615, 620, 625, 630, 640, 645, 650, 655, 665, 670 may have spectral bands within the following narrow band properties: (1) from about 1.5 to 1.7 μm, as depicted in nominal curve 805; (2) from about 2.0 to 2.5 μm, as depicted in nominal curve 810; (3) from about 3.5, to 3.9 μm, as depicted in nominal curve 815; and (4) from about 4.7 to 4.9 μm, as depicted in nominal curve 820.

Figure 9A:
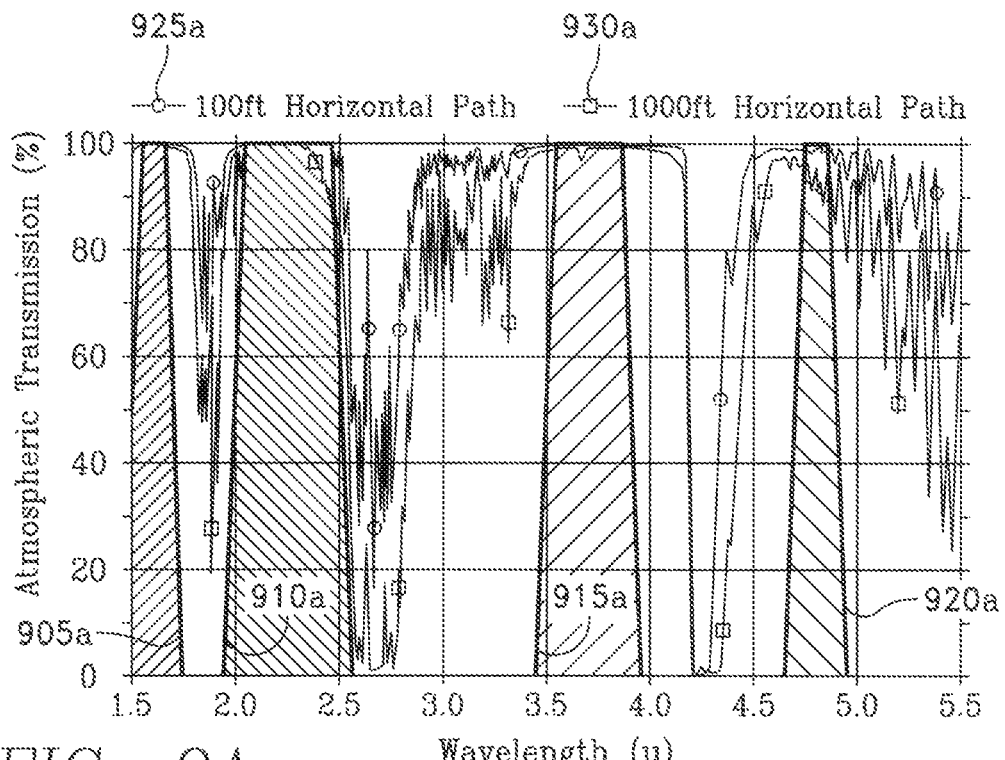
FIGS. 9A to 9D are four graphs depicting the atmospheric transmissions at four different altitudes for two horizontal paths across the 1.5 to 5.5 μm range and depict the operating regions for four bandpass filters within that spectral range.
Figure 9B:
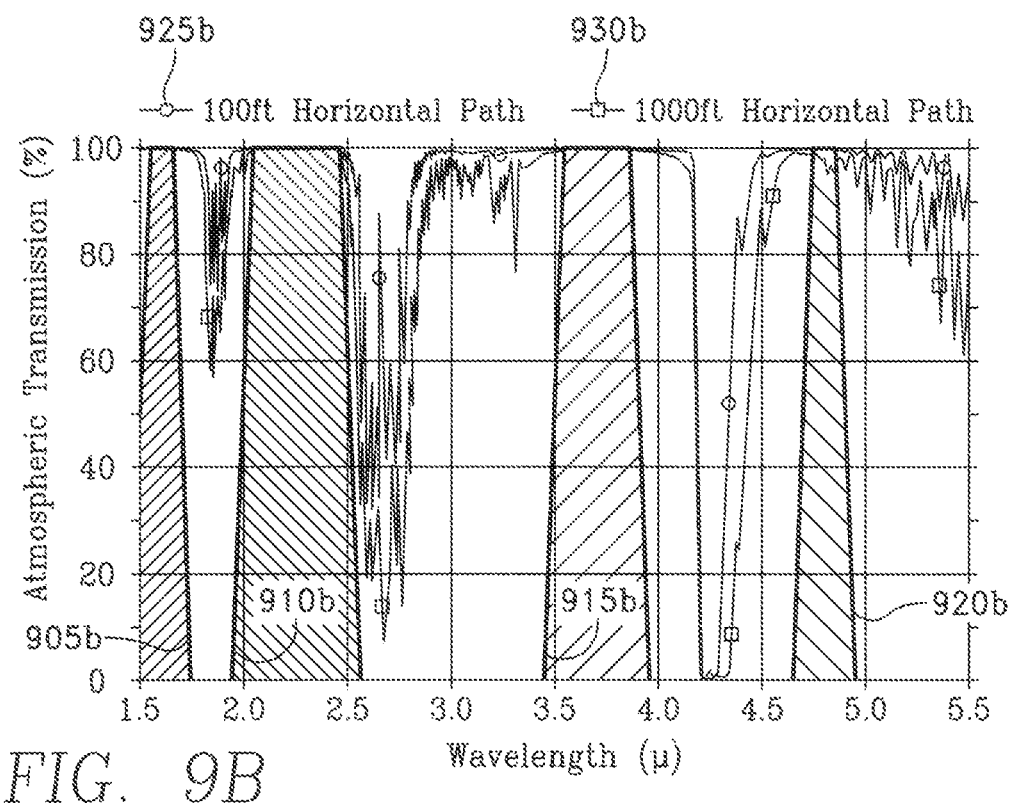
Figure 9C:
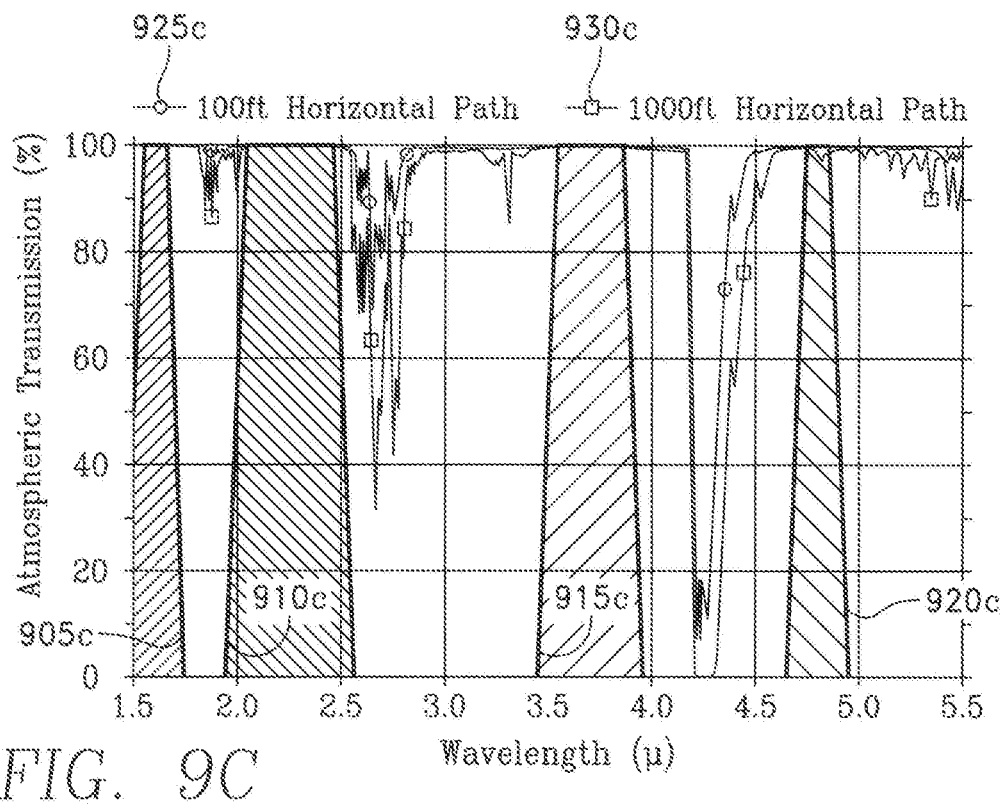
Figure 9D:
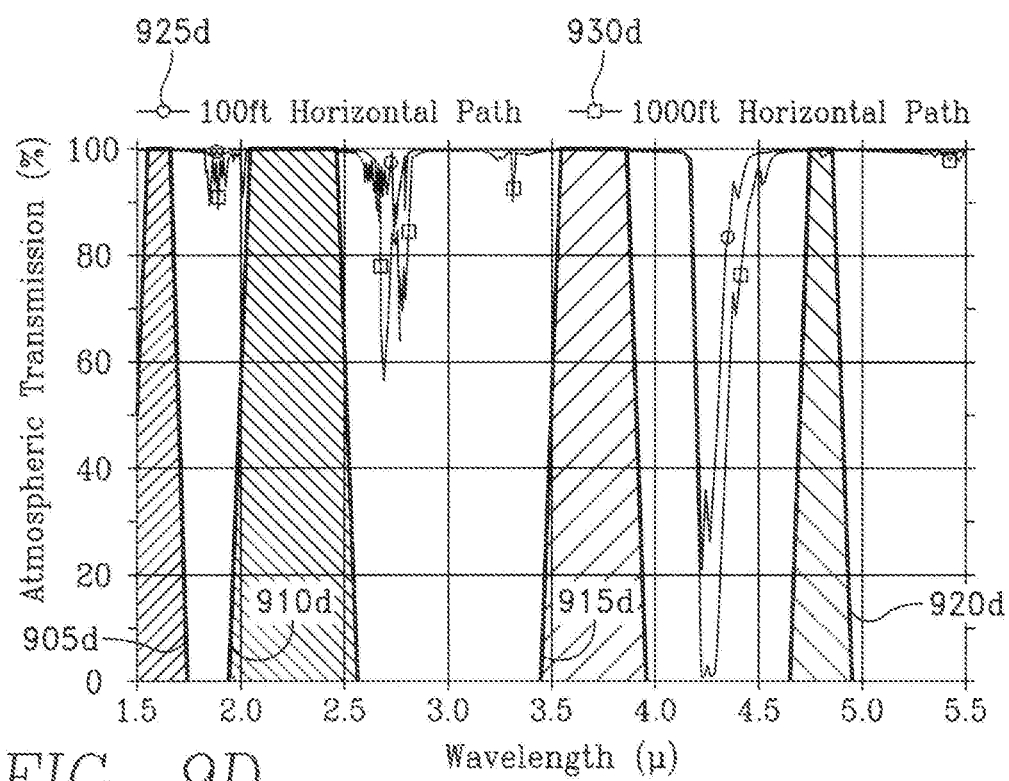

FIGS. 9A to 9D are four graphs depicting the atmospheric transmissions at four different altitudes for two horizontal paths across the 1.5 to 5.5 μm range and depict the operating regions for four bandpass filters within that spectral range, Specifically, using the U.S. Standard Atmosphere (1976) to define atmospheric transmission as a function of wavelength, FIG. 9A depicts two plots 925a, 930a representing horizontal paths at 100 feet and 1,000 feet, respectively, at an altitude of 10,000 feet with four nominal curves 905a, 910a, 915a, 920a representing the operating regions of the four bandpass filters; FIG. 9B depicts two plots 925b, 930b representing horizontal paths at 100 feet and 1,000 feet, respectively, at an altitude of 20,000 feet with four nominal curves 905b, 910b, 915b, 920b representing the operating regions of the four bandpass filters; FIG. 9C depicts two plots 925c, 930c representing horizontal paths at 100 feet and 1,000 feet, respectively, at an altitude of 30,000 feet with four nominal curves 905c, 910c, 915c, 920c representing the operating regions of the four bandpass filters; and FIG. 9D depicts two plots 925d, 930d representing horizontal paths at 100 feet and 1,000 feet, respectively, at an altitude of 40,000 feet with four nominal curves 905d, 910d, 915d, 920d representing the operating regions of the four bandpass filters. Importantly, FIGS. 9A to 9D show that, as altitude increases, the atmospheric attenuation decreases. Thus, the atmospheric windows generally improve with any increase in altitude.

Figure 10A:
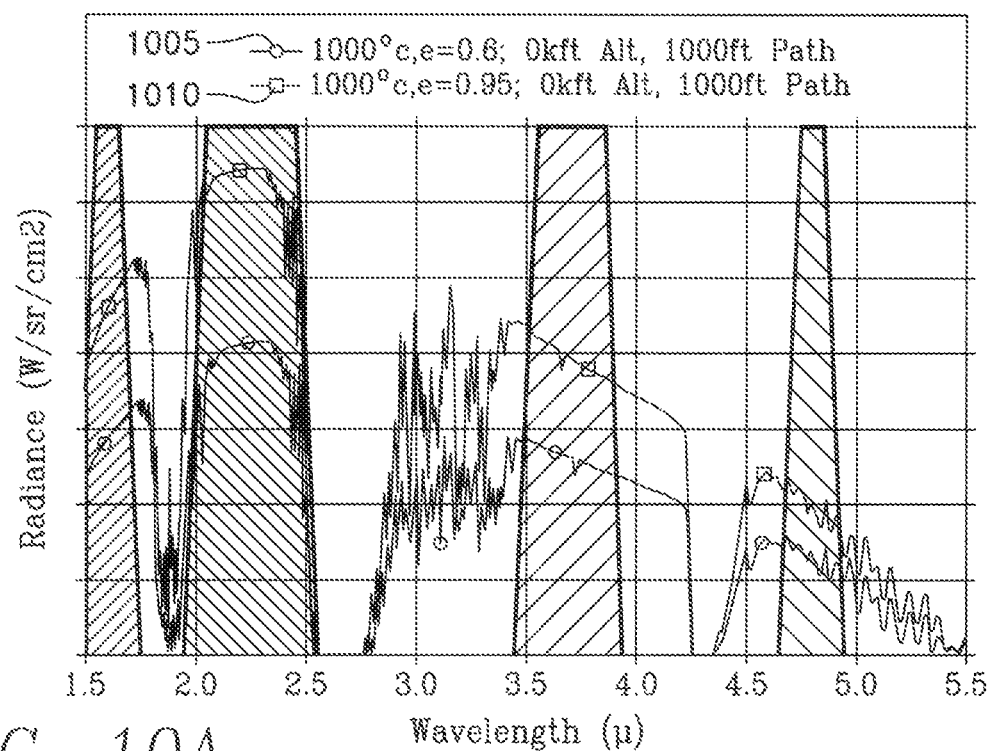
FIGS. 10A and 10B are graphs depicting the spectral emissions of two gray body sources at two emissivity values across the 1.5 to 5.5 μm range at a high temperature.
Figure 10B:
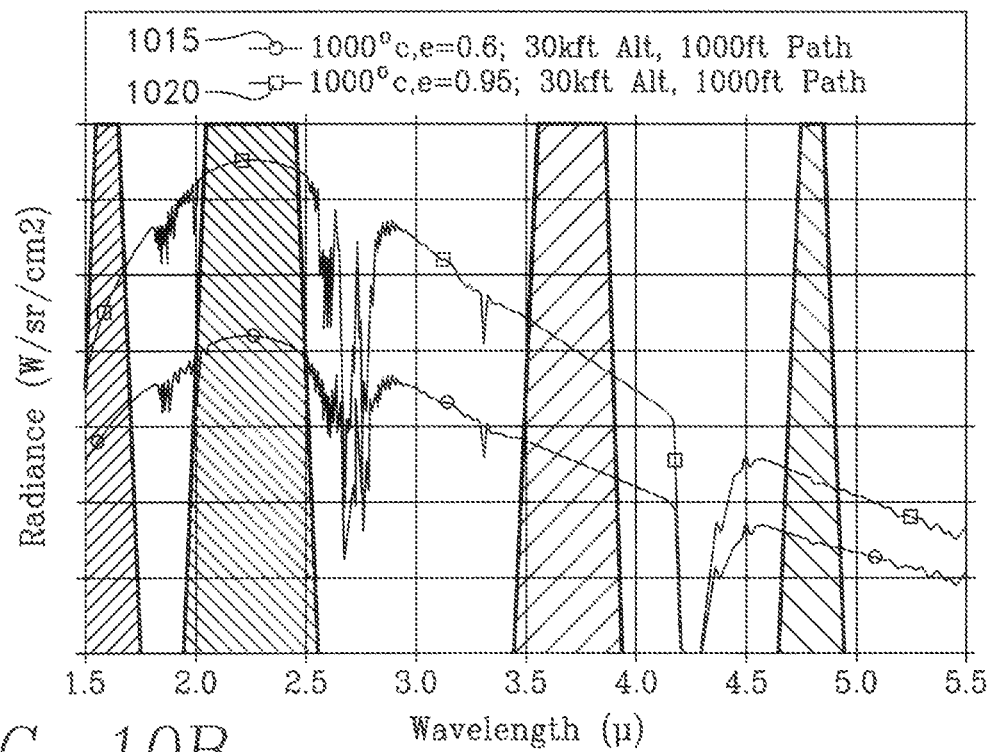

FIGS. 10A and 10B are graphs depicting the spectral emissions of two gray body sources at two emissivity values across the 1.5 to 5.5 μm range at a high temperature. Specifically, using Planck's Law to define radiance as a function of wavelength, plot 1005 in FIG. 10A depicts the spectral emission of a gray body source exhibiting 60% emissivity at a temperature of 1000° C. through a horizontal path of 1,000 feet and at an altitude of 0 feet. Plot 1010 in FIG. 10A depicts the spectral emission of a gray body source exhibiting 95% emissivity at a temperature of 1000° C. through a horizontal path of 1,000 feet and at an altitude of 0 feet. Plot 1015 in FIG. 10B depicts the spectral emission of a gray body source exhibiting 60% emissivity at a temperature of 1.000° C. through a horizontal path of 1,000 feet and at an altitude of 30,000 feet, and plot 1020 in FIG. 10B depicts the spectral emission of a gray body source exhibiting 95% emissivity at a temperature of 1000° C. through a horizontal path of 1,000 feet and at an altitude of 30,000 feet.

Importantly, based on FIGS. 10A and 10B, the temperature and emissivity may be determined by using the bandpass filters 615, 620, 625, 630, 640, 645, 650, 655, 665, 670 in FIGS. 6A to 6C. As discussed above, the bandpass filters 615, 620, 625, 630, 640, 645, 650, 655, 665, 670 may be used to acquire radiometric measurements at pre-determined spectral bands. By obtaining these radiometric measurements at these spectral bands, ratios between these spectral bands can be calculated. The spectral band ratios can then be used to predict temperature and emissivity.

Examples of band ratios obtained from the bandpass filters 615, 620, 625, 630, 640, 645, 650, 655, 665, 670 for higher temperatures may include the following:

Spectral band ratio 1: 1.5-1.7 μm to 2.0-2.5 μm
Spectral band ratio 2: 1.5-1.7 μm to 3.5-3.9 μm
Spectral band ratio 3: 1.5-1.7 μm to 4.7-4.9 μm
Spectral band ratio 4: 2.0-2.5 μm to 3.5-3.9 μm
Spectral band ratio 5: 2.0-2.5 μm to 4.7-4.9 μm
Spectral band ratio 6: 3.5-3.9 μm to 4.7-4.9 μm In order to obtain the spectral band ratios of these bandpass filters 620, 625, 645, 650, 665, 670, radiometric measurements are generally collected and acquired from the detector elements corresponding to these bandpass filters 620, 625, 645, 650, 665, 670. These radiometric measurements may then be used to calculate the ratio values by determining the relationship between the two spectral bands. Once the ratio value is obtained, this ratio value may be used in conjunction with a lookup table for that spectral band to determine the temperature and emissivity of a black body source.

By way of example, using the above spectral band ratios for temperatures 300° C. and 1000° C. at an altitude of 0 feet through a horizontal path of 1,000 feet, the ratio values for emissivity of 60% and 95% are generally the same, as shown below:

For 300° C.:
Spectral band ratio 1: 38.93
Spectral band ratio 2: 212.51
Spectral band ratio 3: 119.99
Spectral band ratio 4: 5.46
Spectral band ratio 5: 3.08
Spectral band ratio 6: 0.56
For 1000° C.:
Spectral band ratio 1: 3.49
Spectral band ratio 2: 1.85
Spectral band ratio 3: 0.46
Spectral band ratio 4: 0.53
Spectral band ratio 5: 0.13
Spectral band ratio 6: 0.25

Based on these ratio values, the temperature of a black body source can be predicted. Small errors may be attributed to the varying altitudes and transmissions, but given that these spectral bands are selected based on good windows, the error is generally minimal. Details about determining temperature values using the spectral band ratios obtained from the bandpass filters 615, 620, 625, 630, 640, 645, 650, 655, 665, 670 are further described below in more detail via method 1400 in FIG. 14.

Finally, as shown, in FIGS. 10A and 10B, spectral emissions obtained from bandpass filters 615, 640 in spectral band 1.5 to 1.7 μm appear to be least affected by atmospheric attenuation. Spectral emissions obtained from bandpass filters 630, 655 (i.e., 4.7 to 4.9 μm), on the other hand, appear to be greatly affected by atmospheric attenuation.

It is important to note that temperature may also be determined by relating the measured infrared energy to the temperature of an ideal black body source radiating an equivalent amount of energy according, to Planck's Law. Because the emissivity of an object affects how much energy an object emits, emissivity may also influence the temperature calculation.

Figure 11A:
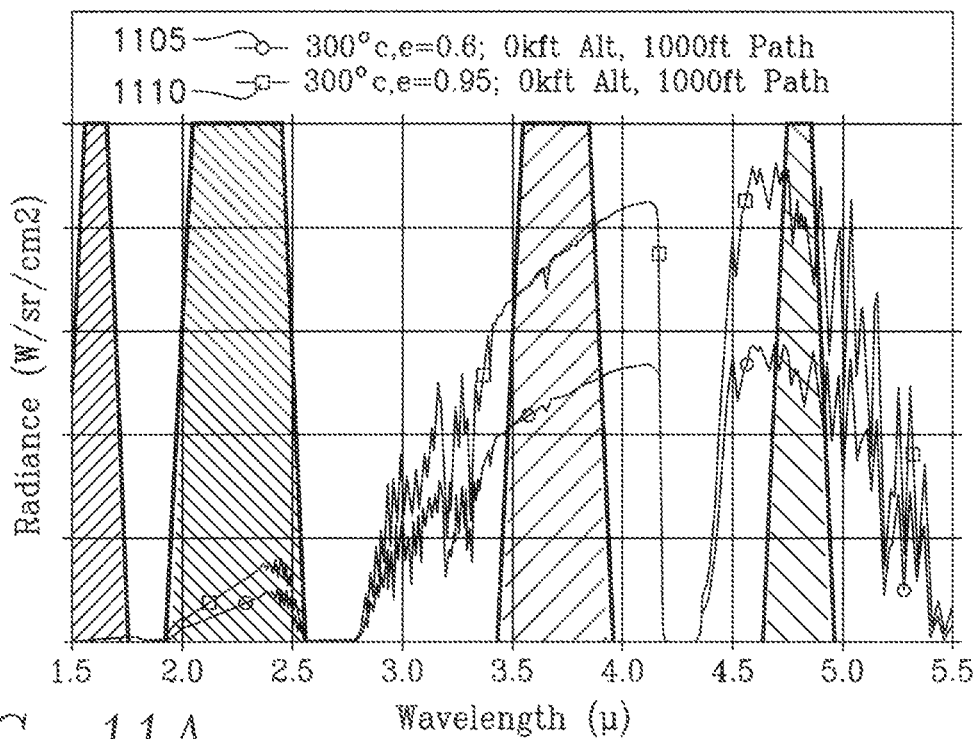
FIGS. 11A and 11B are graphs depicting the spectral emissions of two gray body sources at two emissivity values across the 1.5 to 5.5 μm range at a low temperature.
Figure 11B:
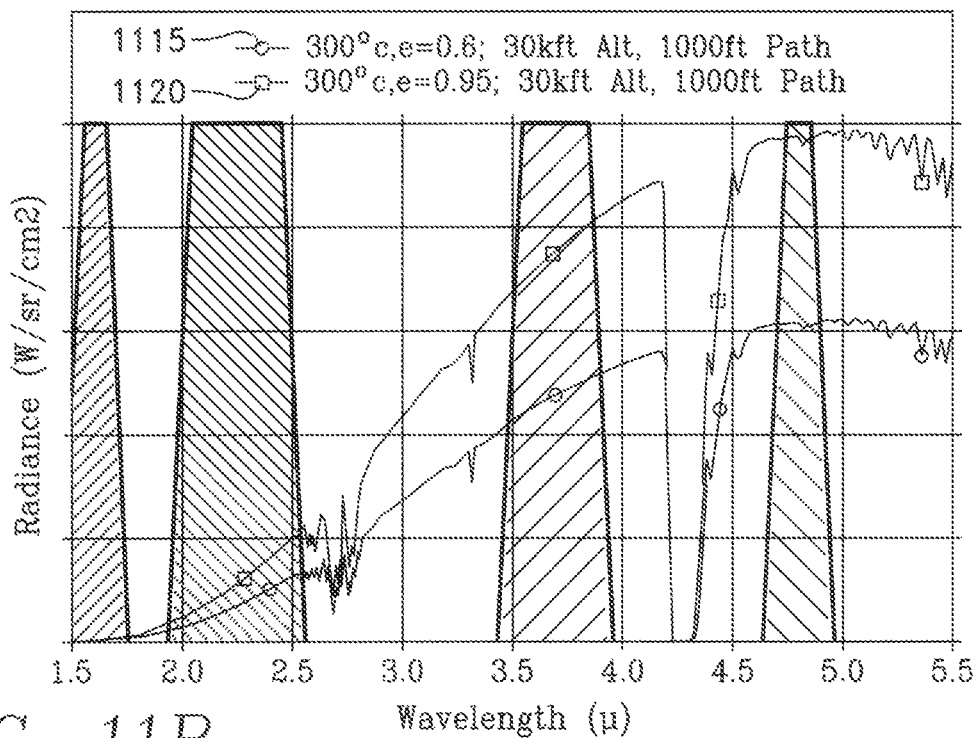

FIGS. 11A and 11B are graphs depicting the spectral emissions of two gray body sources at two emissivity values across the 1.5 to 5.5 μm range at a low temperature. Specifically, using Planck's Law to define radiance as a function of wavelength, plot 1105 in FIG. 11A depicts the spectral emission of a gray body source exhibiting 60% emissivity at a temperature of 300° C. through a horizontal path of 1,000 feet and at an altitude of 0 feet. Plot 1110 in FIG. 11A depicts the spectral emission of a gray body source exhibiting 95% emissivity at a temperature of 300° C. through a horizontal path of 1,000 feet and at an altitude of 0 feet. Plot 1115 in FIG. 11B depicts the spectral emission of a gray body source exhibiting 60% emissivity at a temperature of 300° C. through a horizontal path of 1,000 feet and at an altitude of 30,000 feet. Plot 1120 in FIG. 11B depicts the spectral emission of a gray body source exhibiting 95% emissivity at a temperature of 300° C. through a horizontal path of 1,000 feet and at an altitude of 30,000 feet.

According to Planck's Law and as shown in FIGS. 11A and 11B, as temperature decreases, the short-wavelength radiation likewise generally decreases. Thus, the spectral emissions obtained from bandpass filters 615, 640 (i.e., 1.5 to 1.7 μm) might not provide sufficient signal strength to accurately predict lower temperatures. As a result, it is generally recommended that the following spectral band ratios for bandpass filters 620, 625, 630, 645, 650, 655, 665, 670 be used to determine lower temperatures:

Spectral band ratio 1: 2.0-2.5 μm to 3.5-3.9 μm
Spectral band ratio 2: 2.0-2.5 μm to 4.7-4.9 μm
Spectral band ratio 3: 3.5-3.9 μm to 4.7-4.9 μm As discussed above, by obtaining ratio values of the radiometric measurements at these spectral bands, temperature and emissivity may be predicted. Temperature may also be determined by relating the measured infrared energy to the temperature of an ideal black body source radiating an equivalent amount of energy, according to Planck's Law. Because certain passbands perform better than others, filter selection of the bandpass filters 615, 620, 625, 630, 640, 645, 650, 655, 665, 670 may also be used to predict temperatures. For example, the band ratio 2.0-2.5 μm to 3.5-3.9 μm may perform the best for the largest temperature range, and therefore, may be selected as the primary prediction of a spectral band ratio. Bandpass filters 615, 640 associated with spectral band 1.5-1.7 μm may be used as a secondary ratio for higher temperatures. Bandpass filters 630, 655 associated with the spectral band 4.7-4.9 μm may be used as a secondary ratio for lower temperatures.

Finally, FIGS. 11A and 11B show that spectral emissions obtained from bandpass filters 630, 655 in spectral band 4.7 to 4.9 μm appear to be greatly affected by atmospheric attenuation at lower altitudes. The bandpass filters 615, 620, 625, 630, 640, 645, 650, 655, 665, 670 also typically perform outside the $H_2O$ and $CO_2$ absorption/emitter regions. Thus, typical spectral emitters (e.g., aircraft plume) may not significantly radiate within the spectral regions of these bandpass filters 615, 620, 625, 630, 640, 645, 650, 655, 665, 670 and thus may not corrupt gray body temperature predictions.

Figure 12A:
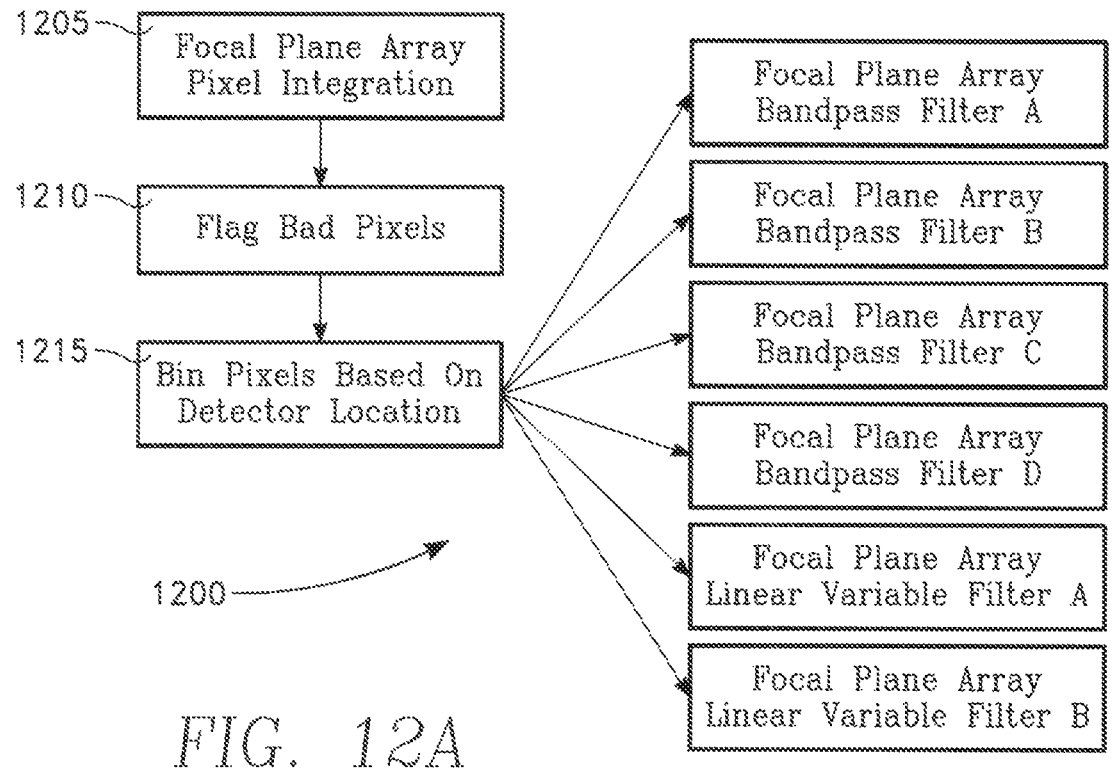
FIGS. 12A and 12B are flow charts that depict embodiments of an integration method and a signal processing method, in accordance with the present disclosure.
Figure 12B:
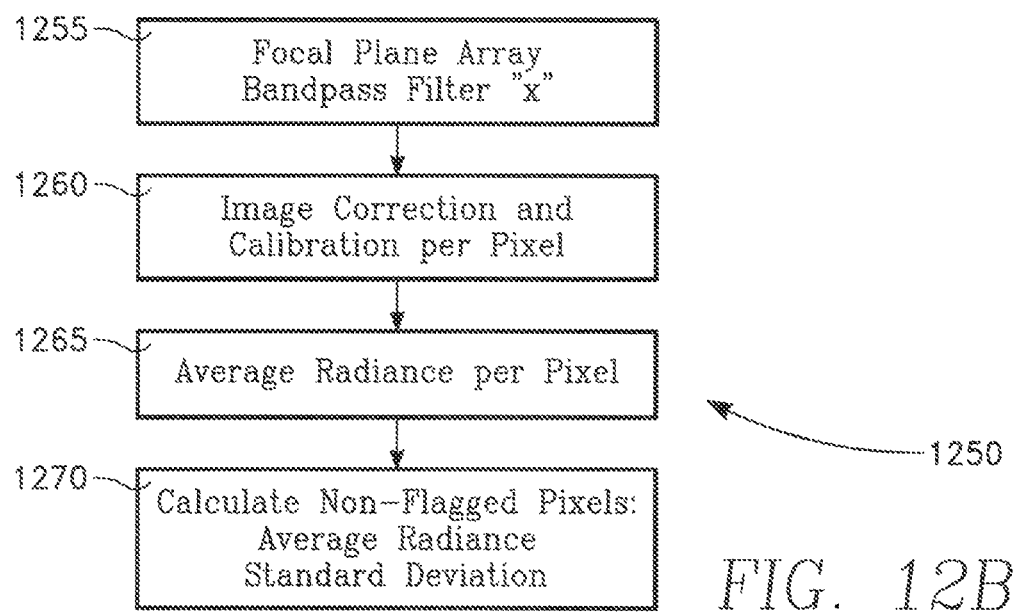

FIGS. 12A and 12B are flow charts that depict embodiments of an integration method and a signal processing method, in accordance with the present disclosure. In particular, FIG. 12A depicts an embodiment of an integration method 1200 for the focal plane array detector, whereas FIG. 12B depicts an embodiment of a signal processing method 1250 for determining radiance values from a particular band pass filter.

As spectral energy is collected from a particular bandpass filter 615, 620, 625, 630, 640, 645, 650, 655, 665, 670 at the focal plane array 400, electromagnetic radiation may be filtered and may travel to a pixel or detector element of the detector 140. That detector element may then simultaneously generate a signal, indicative to the incident radiation focused thereupon.

When generating the signal, the detector 140 may utilize various signal integration techniques, in FIG. 12A, for example, electromagnetic radiation for each pixel incident upon each detector element may be integrated and sent to the digital signal processor (step 1205). During this time, bad pixels may be flagged (step 1210) via calibration or an incorrectly responding pixel. Once sent to the digital signal processor, the pixels may be categorized into filter bins based on detector location, as shown in step 1215.

When the integrated signal is read-out or sampled, radiance values may also be calculated, as shown in FIG. 12B. First, in steps 1255, 1260, image correction and calibration may occur for each pixel for each band pass filter region on the focal plane array. Here, bad pixels or images may be corrected and/or calibrated by applying focal plane normalization techniques. This may involve utilizing a predefined look-up table per pixel to calibrate the bad pixel/image. Once the calibrations are applied and corrected, the average radiance values per pixel may be calculated and determined for that detector element, as shown in step 1265. For non-flagged pixels, step 1270 shows that the average radiance and standard deviation may be determined.

Regarding improving SNR ratios, the relative background radiation spectral intensity for wavelengths less than 1.5 µm is substantially less than the background spectral intensity for wavelengths greater than 5.5 µm. Therefore, in order to minimize background radiation and improve SNR ratios of radiation emission measurements, bandpass filters 615, 620, 625, 630, 640, 645, 650, 655, 665, 670 may filter electromagnetic emissions by eliminating spectral emissions outside the intended range. As a result, less background radiation may be incident upon each individual detector element, causing each detector element to operate at a point well below its saturation point. This in turn may improve quantum efficiency and further improving SNR ratios. Moreover, longer integration times may be achieved without saturation or near saturation of the detector elements.

The bandpass filters 615, 620, 625, 630, 640, 645, 650, 655, 665, 670 may also limit the radiation incident upon each detector element to a narrow band. By performing and combining measurements using various bandpass filters 615, 620, 625, 630, 640, 645, 650, 655, 665, 670 having different absorption characteristics (and the higher fidelity spectral distribution of the linear variable filters 605, 610, 635.660), a true spectral distribution of the IR spectral emission can be determined.

Figure 13:
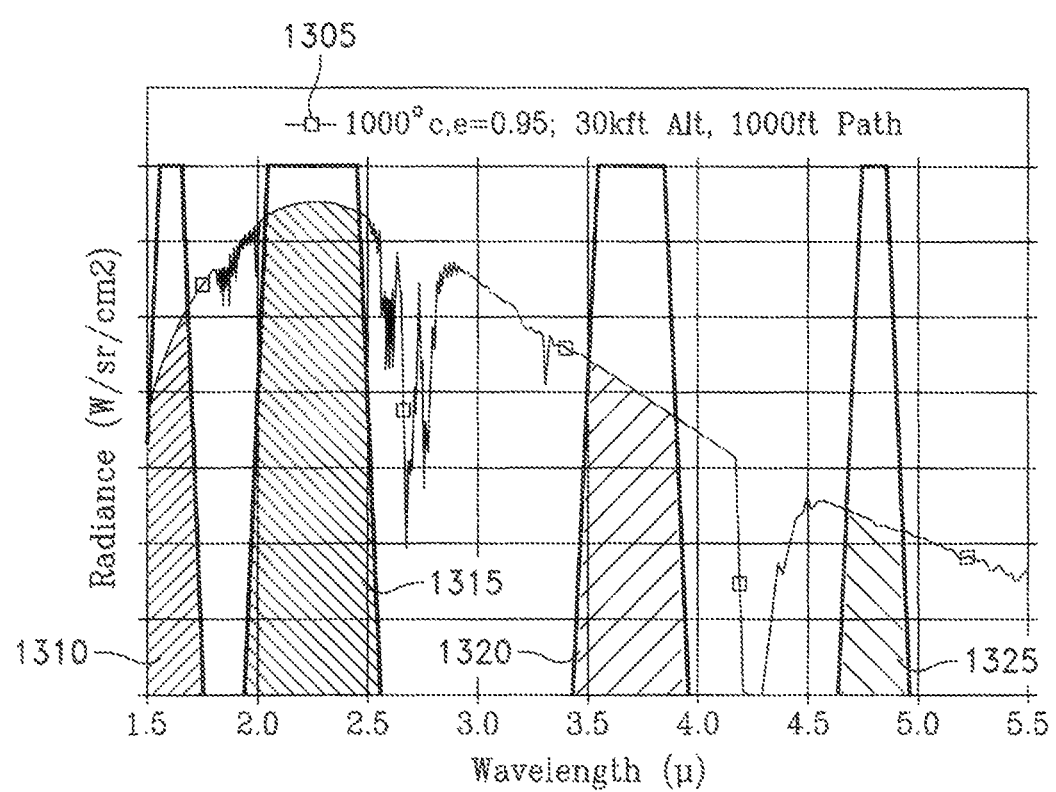
FIG. 13 is graph, depicting the radiance values for the all bandpass filter regions calculated and obtained from the methods in FIG. 12.

FIG. 13 is graph, depicting the radiance values for the all bandpass filter regions calculated and obtained from the method in FIG. 12. Using Planck's Law to define radiance as a function of wavelength, FIG. 13 depicts plot 1305 of the gray body source, which exhibits 95% emissivity for 1000° C. through a horizontal path of 1,000 feet and at an altitude of 30,000 feet. As shown in FIG. 13, area 1310 depicts the radiance values obtained from bandpass filters 615, 640 (1.5 to 1.7 µm); area 1315 depicts the radiance values obtained from bandpass filters 620, 645, 665 (2.0 to 2.5 µm); area 1320 depicts the radiance values obtained from bandpass filters 625, 650, 670 (3.5 to 3.9 µm); and area 1325 depicts the radiance values obtained from bandpass filters 630, 655 (4.7 to 4.9 µm).

Figure 14:
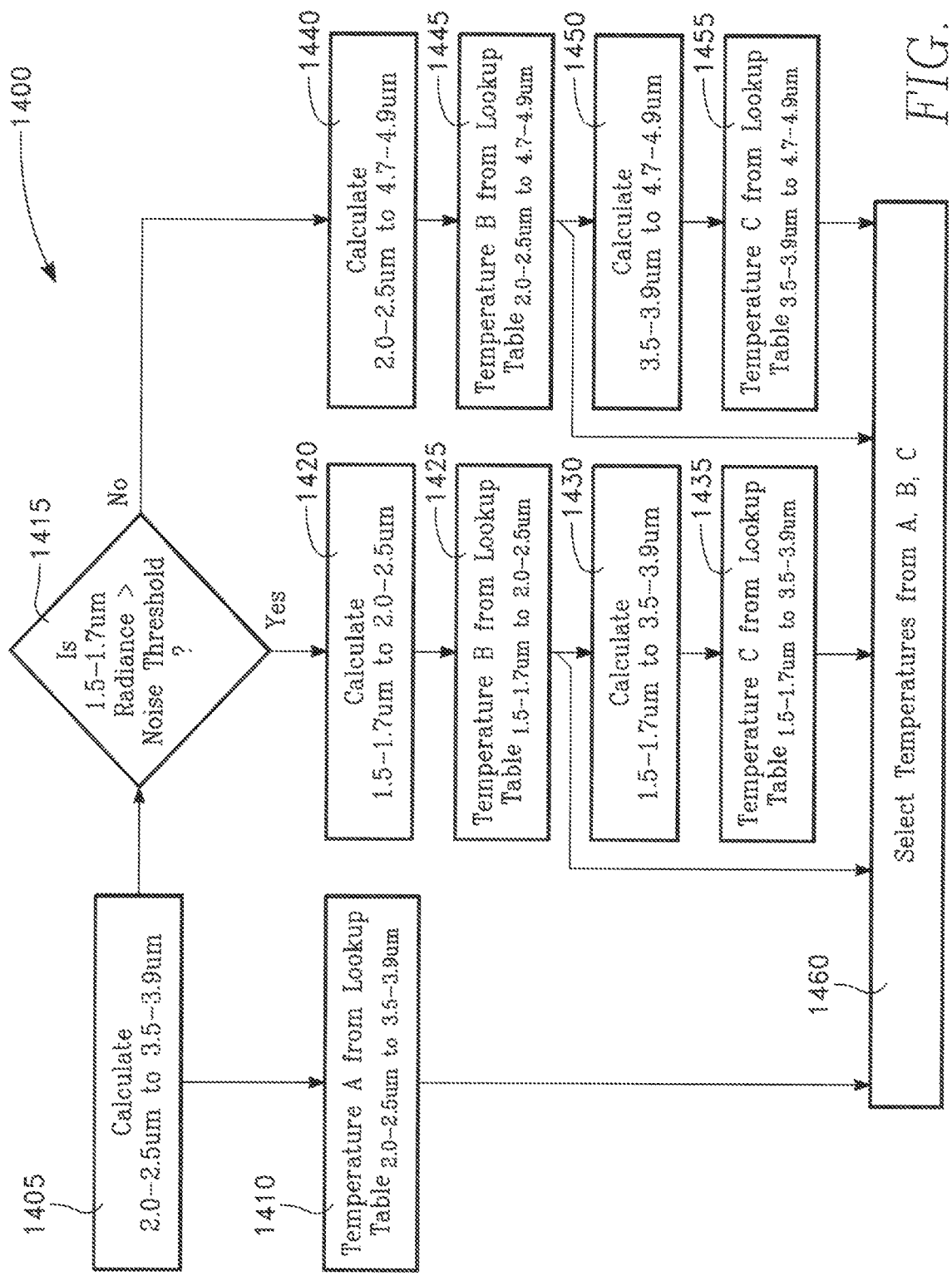
FIG. 14 is a flow chart depicting one embodiment of a method for determining temperature values using spectral band ratios obtained from the bandpass filters.

FIG. 14 is a flow chart depicting one embodiment of a method for determining temperature values using spectral band ratios obtained from the bandpass filters. As shown in FIG. 14, one embodiment of the method 1400 may comprise the first step 1405 of calculating a first spectral band ratio emitted from bandpass filters 620, 645, 665 (2.0 to 2.5 µm) to bandpass filters 625, 650, 670 (3.5 to 39 µm). In order to obtain the spectral band ratio of these bandpass filters 620, 625, 645, 650, 665, 670, radiometric measurements are generally collected and acquired from the detector elements corresponding to these bandpass filters. These radiometric measurements may then be used to calculate the ratio values by determining the relationship between the two spectral bands (2.0 to 2.5 µm) and (3.5 to 3.9 µm). Once the ratio value is obtained, this ratio value may be used in conjunction with a lookup table for that spectral band. In this manner, a first temperature A may be determined, as shown in step 1410.

Turning to step 1415, the method 1400 may include determining whether the radiance value for spectral band 1.5 to 1.7 µm is greater than the background noise or noise threshold. As discussed above in FIGS. 11A and 11B, lower temperatures may affect the 1.5 to 1.7 µm spectral band. This is typically because lower temperature may decrease the lower short-wavelength radiation, resulting with an insufficient signal to accurately predict lower temperatures. In the event that the radiometric values of spectral band 1.5 to 1.7 µm is greater than the background noise or noise threshold, the method 1400 may proceed to step 1420, which is calculating a second spectral band ratio of bandpass filters 615, 640 (1.5 to 1.7 µm) to bandpass filters 620, 645, 665 (2.0 to 2.5 µm).

Like step 1405, step 1420 involves obtaining the spectral band ratio of these bandpass filters 620, 625, 645, 650, 665, 670. This may involve acquiring radiometric measurements at these spectral bands and determining the numerical relationship between the two spectral bands (1.5 to 1.7 µm) and (2.0 to 2.5 µm). By applying the ratio of these spectral bands and a lookup table (1.5-1.7 µm, to 2.0-2.5 µm), a second temperature B may be determined, as shown in, step 1425.

After step 1425, a third temperature C may be determined via steps 1430 and 1435. Specifically, in step 1430, the third spectral band ratio of bandpass filters 615, 640 (1.5 to 1.7 µm) to bandpass filters 625, 650, 670 (3.5 to 3.9 µm) may be calculated by obtaining radiometric measurements at these spectral bands. Based on these spectral measurements, spectral band ratio values may be determined, and these ratio values used in conjunction with a lookup table (1.5-1.7 µm to 3.5-3.9 µm) may be used to determine temperature C via step 1435.

On the other hand, referring back to step 1415, in the event that the signal in spectral band. 1.5 to 1.7 µm is Jess than the background noise or noise threshold in step 1415, the method 1400 may proceed to step 1440, which is calculating the spectral band ratio of bandpass filters 620, 645, 665 (2.0 to 2.5 µm) to bandpass filters 630, 655 (4.7 to 4.9 µm). Here, the spectral band ratio may be used in conjunction with the lookup table to determine the second temperature B (step 1445). The third temperature C may also be determined via steps 1450 and 1455. In particular, in step 1450, band ratio of bandpass filters 625, 650, 670 (3.5 to 3.9 µm) to bandpass filters 630, 655 (4.7 to 4.9 µm) may be calculated by obtaining radiometric measurements at these spectral bands. The spectral band ratios used in conjunction with a lookup table for that spectral band ratio (3.5-3.9 µm to 4.7-4.9 µm) may help in determining temperature C via step 1455.

Finally, in step 1460, a temperature may be selected based on the calculated temperatures A, B, and C. If the radiance values for the 1.5-1.7 µm spectral band is greater than the noise threshold, temperatures A, B, and C may be obtained from steps 1410, 1425, 1435. On the other hand, if the radiance values for the 1.5-1.7 µm spectral band is less than the noise threshold, temperatures A, B, and C may be obtained from steps 1410, 1445, 1455.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The components, steps, features, objects, benefits, and advantages that have been discussed are merely illustrative, and none of them, nor the discussions relating to them, are intended to limit the scope of protection in any way. Numerous other embodiments are also contemplated, including embodiments that have fewer, additional, and/or different components, steps features, objects, benefits, and advantages. The components and steps may also be arranged and ordered differently.

The foregoing description of the preferred embodiment has been presented for the purposes of illustration and description. While multiple embodiments are disclosed, still other embodiments will become apparent to those skilled in the art from the above detailed description. As will be realized, the scope of protection is capable of modifications in various obvious aspects, all without departing from the spirit and scope of the present disclosure. Accordingly, the detailed description is to be regarded as illustrative in nature and not restrictive. Also, although not explicitly recited, one or more embodiments may be practiced in combination or conjunction with one another.

Furthermore, the reference or non-reference to a particular embodiment shall not be interpreted to limit the scope of protection. It is intended that the scope of protection not be limited by this detailed description, but by the claims and the equivalents to the claims that are appended hereto.

Except as stated immediately above, nothing which has been stated or illustrated is intended or should be interpreted to cause a dedication of any component, step, feature, object, benefit, advantage, or equivalent to the public, regardless of whether it is or is not recited in the claims. The scope of protection is limited solely by the claims that now follow, and that scope is intended to be broad as is reasonably consistent with the language that is used in the claims. The scope of protection is also intended to be broad to encompass all structural and functional equivalents.

What is claimed as new and desired to be protected by Letters Patent is set forth in the appended claims:

1. A background subtracted spectrometer for airborne infrared radiometry, comprising:
    a chopper configured to modulate an electromagnetic radiation;
    a detector lens configured to directly receive said modulated electromagnetic radiation from said chopper;
    a filter array configured to selectively pass a plurality of different spectral bands of electromagnetic radiation, said filter array comprising:
        a linear variable filter; and
        a plurality of bandpass filters; and
    a detector comprising a focal plane array configured to receive said plurality of different spectral bands of electromagnetic radiation simultaneously transmitted through said filter array, said detector being configured to generate one or more electrical signals indicative of electromagnetic radiation intensity as a function of wavelength;
    wherein said detector lens is disposed directly between said chopper and said filter array, such that said electromagnetic radiation modulated through said chopper travels directly to said detector lens and is refocused onto said filter array disposed on said focal plane array of said detector.

2. The background subtracted spectrometer, as recited in claim 1, characterized in that said linear variable filter is adapted to selectively pass a first spectral band for wavelengths in the range from about 1.5 to about 3.0 µm.

3. The background subtracted spectrometer, as recited in claim 2, characterized in that said plurality of bandpass filters comprises:
    a first bandpass filter adapted to selectively pass a second spectral band for wavelengths in the range from about 2.0 to 2.5 µm; and
    a second bandpass filter adapted to selectively pass a third spectral band for wavelengths in the range from about 3.5 to 3.9 µm.

4. The background subtracted spectrometer, as recited in claim 3, characterized in that:
    said first bandpass filter and said second bandpass filter are arranged in a first row on said focal plane array; and
    wherein said linear variable filter is arranged in a second row on said focal plane array.

5. The background subtracted spectrometer, as recited in claim 1, characterized in that said filter array is not a circular-variable filter; and
    wherein said spectrometer lacks a relay lens.

6. The background subtracted spectrometer, as recited in claim 1, further comprising:
    a dewar disposed within said background subtracted spectrometer and containing liquid nitrogen;
    wherein said filter array and said detector are conductively cooled by said liquid nitrogen.

7. A background subtracted spectrometer for airborne infrared radiometry, comprising:
    a chopper configured to modulate an electromagnetic radiation;
    a detector lens configured to directly receive said modulated electromagnetic radiation from said chopper;
    a filter array configured to selectively pass a plurality of different spectral bands of electromagnetic radiation, said filter array comprising:
        a linear variable filter;
        a first plurality of bandpass filters; and
        a second plurality of bandpass filters; and
    a detector comprising a focal plane array configured to receive said plurality of different spectral bands of electromagnetic radiation simultaneously transmitted through said filter array, said detector being configured to generate one or more electrical signals indicative of electromagnetic radiation intensity as a function of wavelength;
    wherein said detector lens is disposed directly between said chopper and said filter array, such that said electromagnetic radiation modulated through said chopper travels directly to said detector lens and is refocused onto said filter array disposed on said focal plane array of said detector.

8. The background subtracted spectrometer, as recited in claim 7, characterized in that said linear variable filter is adapted to selectively pass a first spectral band for wavelengths in the range from about 1.5 to about 3.0 µm.

9. The background subtracted spectrometer, as recited in claim 8, characterized in that said first plurality of bandpass filters comprises:
    a. first bandpass filter adapted to selectively pass a second spectral band for wavelengths in the range from about 1.5 to 1.7 µm; and
    a second bandpass filter adapted to selectively pass a third spectral band for wavelengths in the range from about 2.0 to 2.5 µm.

10. The background subtracted spectrometer, as recited in claim 9, characterized in that said second plurality of bandpass filters comprises:
    a third bandpass filter adapted to selectively pass a fourth spectral band for wavelengths in the range from about 3.5 to 3.9 µm; and
    a fourth bandpass filter adapted to selectively pass a fifth spectral band for wavelengths in the range from about 4.7 to 4.9 µm.

11. The background subtracted spectrometer, as recited in claim 10, characterized in that said first plurality of bandpass filters is arranged in a first row on said focal plane array;
    wherein said linear variable filter is arranged in a second row on said focal plane array; and
    wherein said second plurality of bandpass filters is arranged in a third row on said focal plane array.

12. The background subtracted spectrometer, as recited in claim 11, characterized in that said filter array is not a circular-variable filter; and wherein said background subtracted spectrometer lacks a relay lens.

13. The background subtracted spectrometer, as recited in claim 12, further comprising:
a dewar disposed within said background subtracted spectrometer and containing liquid nitrogen;
wherein said filter array and said detector are conductively cooled by said liquid nitrogen.

14. A background subtracted spectrometer for airborne infrared radiometry, comprising:
a chopper configured to modulate an electromagnetic radiation;
a detector lens configured to directly receive said modulated electromagnetic radiation from said chopper;
a filter array configured to selectively pass a plurality of different spectral bands of electromagnetic radiation, said filter array comprising:
a first linear variable filter;
a second linear variable filter;
a first plurality of bandpass filters; and
a second plurality of bandpass filters;
a detector comprising a focal plane array configured to receive said plurality of different spectral bands of electromagnetic radiation simultaneously transmitted through said filter array, said detector being configured to generate one or more electrical signals indicative of electromagnetic radiation intensity as a function of wavelength;
wherein said detector lens is disposed directly between said chopper and said filter array, such that said electromagnetic radiation modulated through said chopper travels directly to said detector lens and is refocused onto said filter array disposed on said focal plane array of said detector.

15. The background subtracted spectrometer, as recited in claim 14, characterized in that said first linear variable filter is adapted to selectively pass a first spectral band for wavelengths in the range from about 1.5 to about 3.0 µm.

16. The background subtracted spectrometer, as recited in claim 15, characterized in that said second linear variable filter is adapted to selectively pass a second spectral band for wavelengths in the range from about 3.0 to about 5.0 µm.

17. The background subtracted spectrometer, as recited in claim 16, characterized in that said first plurality of bandpass filters comprises:
a first bandpass filter adapted to selectively pass a third spectral band for wavelengths in the range from about 1.5 to 1.7 µm;
a second bandpass filter adapted to selectively pass a fourth spectral band for wavelengths in the range from about 2.0 to 2.5 µm; and
wherein said second plurality of bandpass filters comprises:
a third bandpass filter adapted to selectively pass a fifth spectral band for wavelengths in the range from about 3.5 to 3.9 µm; and
a fourth bandpass filter adapted to selectively pass a sixth spectral band for wavelengths in the range from about 4.7 to 4.9 µm.

18. The background subtracted spectrometer, as recited in claim 17, characterized in that said first plurality of bandpass filters are arranged in a first row on said focal plane array;
wherein said first linear variable filter is arranged in a second row on said focal plane array;
wherein said second linear variable filter is arranged in a third row on said focal plane array; and
wherein said second plurality of bandpass filters are arranged in a fourth row on said focal plane array.

19. The background subtracted spectrometer, as recited in claim 18, characterized in that said filter array is not a circular-variable filter; and
wherein said background subtracted spectrometer lacks a relay lens.

20. The background subtracted spectrometer, as recited in claim 19, further comprising:
a dewar disposed within said background subtracted spectrometer and containing liquid nitrogen;
wherein said filter array and said detector are conductively cooled by said liquid nitrogen.

* * * * *